United States Patent
Hung et al.

(10) Patent No.: US 10,770,369 B2
(45) Date of Patent: Sep. 8, 2020

(54) SEMICONDUCTOR DEVICE PACKAGE

(71) Applicant: Advanced Semiconductor Engineering, Inc., Kaohsiung (TW)

(72) Inventors: Chih-Pin Hung, Kaohsiung (TW); Tang-Yuan Chen, Kaohsiung (TW); Jin-Feng Yang, Kaohsiung (TW); Meng-Kai Shih, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/112,248

(22) Filed: Aug. 24, 2018

(65) Prior Publication Data
US 2020/0066612 A1 Feb. 27, 2020

(51) Int. Cl.
| H01L 23/34 | (2006.01) |
| H01L 23/367 | (2006.01) |
| H01L 23/538 | (2006.01) |
| H01L 23/00 | (2006.01) |

(52) U.S. Cl.
CPC ...... *H01L 23/3675* (2013.01); *H01L 23/5384* (2013.01); *H01L 23/5386* (2013.01); *H01L 24/16* (2013.01); *H01L 2224/16225* (2013.01)

(58) Field of Classification Search
CPC .................. H01L 23/36; H01L 23/3675; H01L 2924/161
USPC .................................................. 257/704, 713
See application file for complete search history.

(56) References Cited

U.S. PATENT DOCUMENTS

| 5,023,695 A * | 6/1991 | Umezawa ........... H01L 23/4735 257/714 |
| 5,723,904 A | 3/1998 | Shiga |
| 5,819,402 A * | 10/1998 | Edwards ................. H01L 23/42 29/840 |
| 6,870,246 B1 * | 3/2005 | Mullen ............... H01L 23/3675 257/678 |
| 7,301,227 B1 | 11/2007 | Gektin et al. |
| 8,786,075 B1 * | 7/2014 | Miks ................... H01L 23/3675 257/704 |
| 9,666,539 B1 * | 5/2017 | Li ......................... H01L 23/562 |
| 9,859,262 B1 * | 1/2018 | Patel ..................... H01L 23/427 |

(Continued)

OTHER PUBLICATIONS

Electronic Industries Association, Integrated Circuits Thermal Measurement Method—Electrical Test Method (Single Semiconductor Device), EIA/JESD51-1, Dec. 1995, 33 pages.

*Primary Examiner* — Nitin Parekh
(74) *Attorney, Agent, or Firm* — Foley & Lardner LLP

(57) ABSTRACT

A semiconductor device package includes a substrate, a first electronic component, a second electronic component, a heat dissipation lid and a thermal isolation. The substrate has a surface. The first electronic component and the second electronic component are over the surface of the substrate and arranged along a direction substantially parallel to the surface. The first electronic component and the second electronic component are separated by a space therebetween. The heat dissipation lid is over the first electronic component and the second electronic component. The heat dissipation lid defines one or more apertures at least over the space between the first electronic component and the second electronic component. The thermal isolation is in the one or more apertures of the heat dissipation lid.

16 Claims, 23 Drawing Sheets

(56) References Cited

U.S. PATENT DOCUMENTS

| | | | |
|---|---|---|---|
| 2005/0280139 A1* | 12/2005 | Zhao | H01L 23/4334 257/704 |
| 2013/0043581 A1* | 2/2013 | Negoro | H01L 23/13 257/712 |
| 2013/0056864 A1* | 3/2013 | Cho | H01L 23/4334 257/713 |
| 2014/0217575 A1* | 8/2014 | Hung | H01L 21/50 257/713 |
| 2015/0001701 A1* | 1/2015 | Li | H01L 23/02 257/713 |
| 2015/0162307 A1* | 6/2015 | Chen | H01L 23/04 257/712 |
| 2016/0157359 A1* | 6/2016 | Arvelo | H05K 3/30 |
| 2019/0043771 A1* | 2/2019 | Chang | H01L 23/04 |

* cited by examiner

SEMICONDUCTOR DEVICE PACKAGE

BACKGROUND

1. Technical Field

The present disclosure relates to a semiconductor device package, and more particularly, to a semiconductor device package having a heat dissipation lid to dissipate heat from electronic components and thermal isolation to reduce heat transfer between adjacent electronic components of different working powers.

2. Description of the Related Art

The semiconductor industry has seen growth in an integration density of a variety of electronic components in some semiconductor device packages. This increased integration density often corresponds to an increased power density in the semiconductor device packages. As the power density of semiconductor device packages grows, heat dissipation can become desirable in some implementations. Thus, it can be useful in some implementations to provide a semiconductor device package with improved thermal conductivity.

2.5D/3D semiconductor device packages have been used in recent years to provide high performance, to reduce package volume, and to lower power consumption. A 2.5D/3D semiconductor device package, however, may contain two or more chips with different working powers. Heat transferred from a higher temperature chip to a lower temperature chip may result in damage to the latter chip.

SUMMARY

In some embodiments, a semiconductor device package includes a substrate, a first electronic component, a second electronic component, a heat dissipation lid and a thermal isolation. The substrate has a surface. The first electronic component and the second electronic component are over the surface of the substrate and arranged along a direction substantially parallel to the surface. The first electronic component and the second electronic component are separated by a space. The heat dissipation lid is over the first electronic component and the second electronic component, and includes or defines one or more apertures at least over the space between the first electronic component and the second electronic component. Thermal isolation is disposed in the one or more apertures of the heat dissipation lid.

In some embodiments, a semiconductor device package includes a substrate, a plurality of electronic components, a heat dissipation lid and a thermal isolation. The substrate has a surface. The electronic components are over the surface of the substrate. The heat dissipation lid is over the electronic components, wherein the heat dissipation lid includes or defines one or more apertures. The thermal isolation is disposed in the one or more apertures of the heat dissipation lid, and the ratio of the thermal conductivity of the heat dissipation lid to the thermal conductivity of the thermal isolation is higher than 30.

In some embodiments, a semiconductor device package includes a substrate, a first electronic component, a second electronic component, a heat dissipation lid and a thermal isolation. The substrate has a surface. The first electronic component and the second electronic component are over the surface of the substrate and arranged along a direction substantially parallel to the surface. The first electronic component and the second electronic component are separated by a space. The heat dissipation lid is over the first electronic component and the second electronic component, and includes or defines one or more apertures at least over the space between the first electronic component and the second electronic component. The thermal isolation is disposed in the one or more apertures of the heat dissipation lid. The temperature difference between the first electronic component and the second electronic component is greater than 3° C. when the first electronic component and the second electronic component are in operation.

BRIEF DESCRIPTION OF THE DRAWINGS

Aspects of some embodiments of the present disclosure are best understood from the following detailed description when read with the accompanying figures. Various structures may not be drawn to scale, and the dimensions of the various structures may be arbitrarily increased or reduced for clarity of discussion.

DETAILED DESCRIPTION

Figure 1:
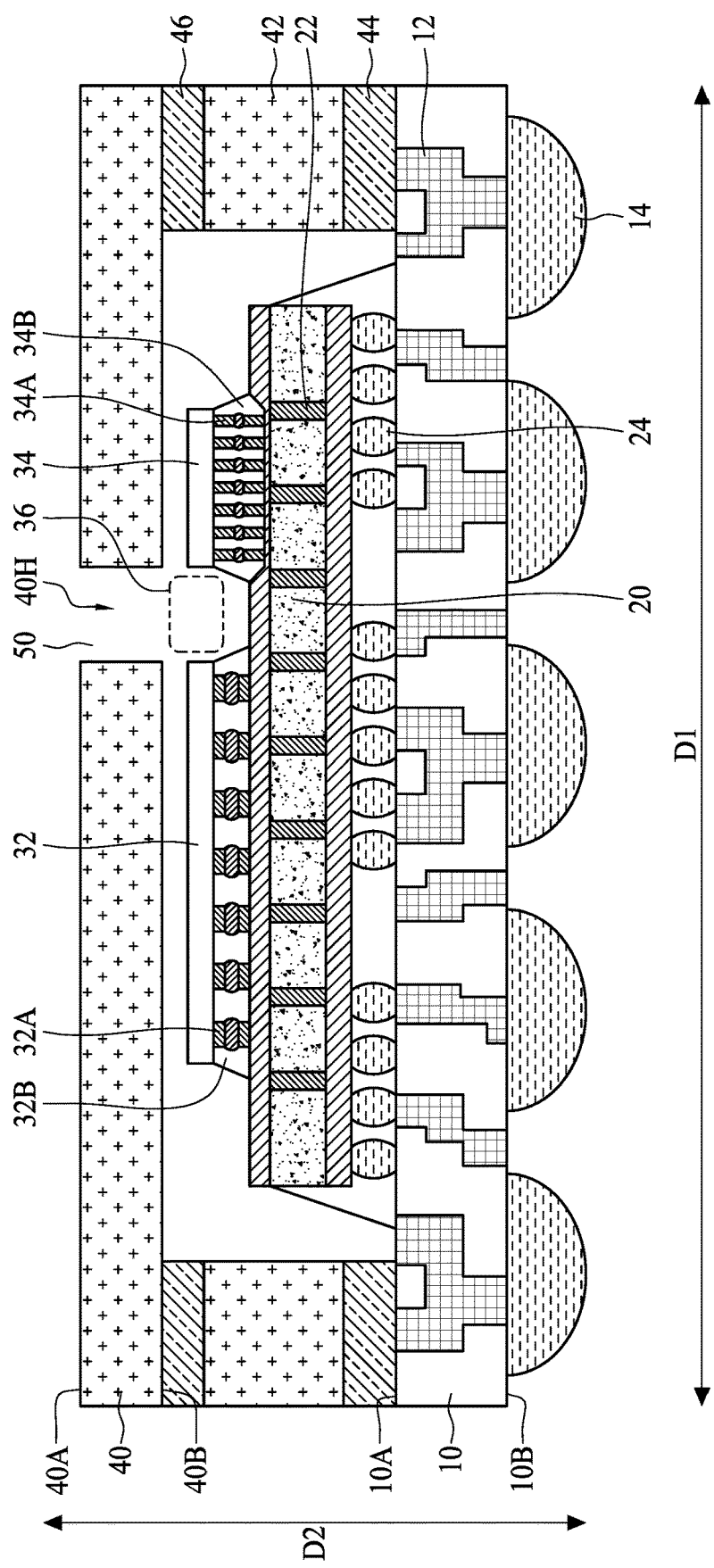
FIG. 1 is a cross-sectional view of a semiconductor device package in accordance with some embodiments of the present disclosure.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that such arrangement does not deviate from the merits of the embodiments of this disclosure.

The following description includes description of some semiconductor device packages, and methods of manufacturing thereof. In some embodiments, the semiconductor device package includes a heat dissipation lid having higher thermal conductivity and thermal isolation having lower thermal conductivity. The heat dissipation lid with higher thermal conductivity helps to improve heat dissipation along the vertical direction such that heat generated by the electronic components in operation is efficiently dissipated. The thermal isolation with lower thermal conductivity is effected by the one or more apertures, and helps to inhibit heat transfer in the heat dissipation lid along the lateral direction, thereby preventing damage to the lower-power electronic component.

Figure 2:
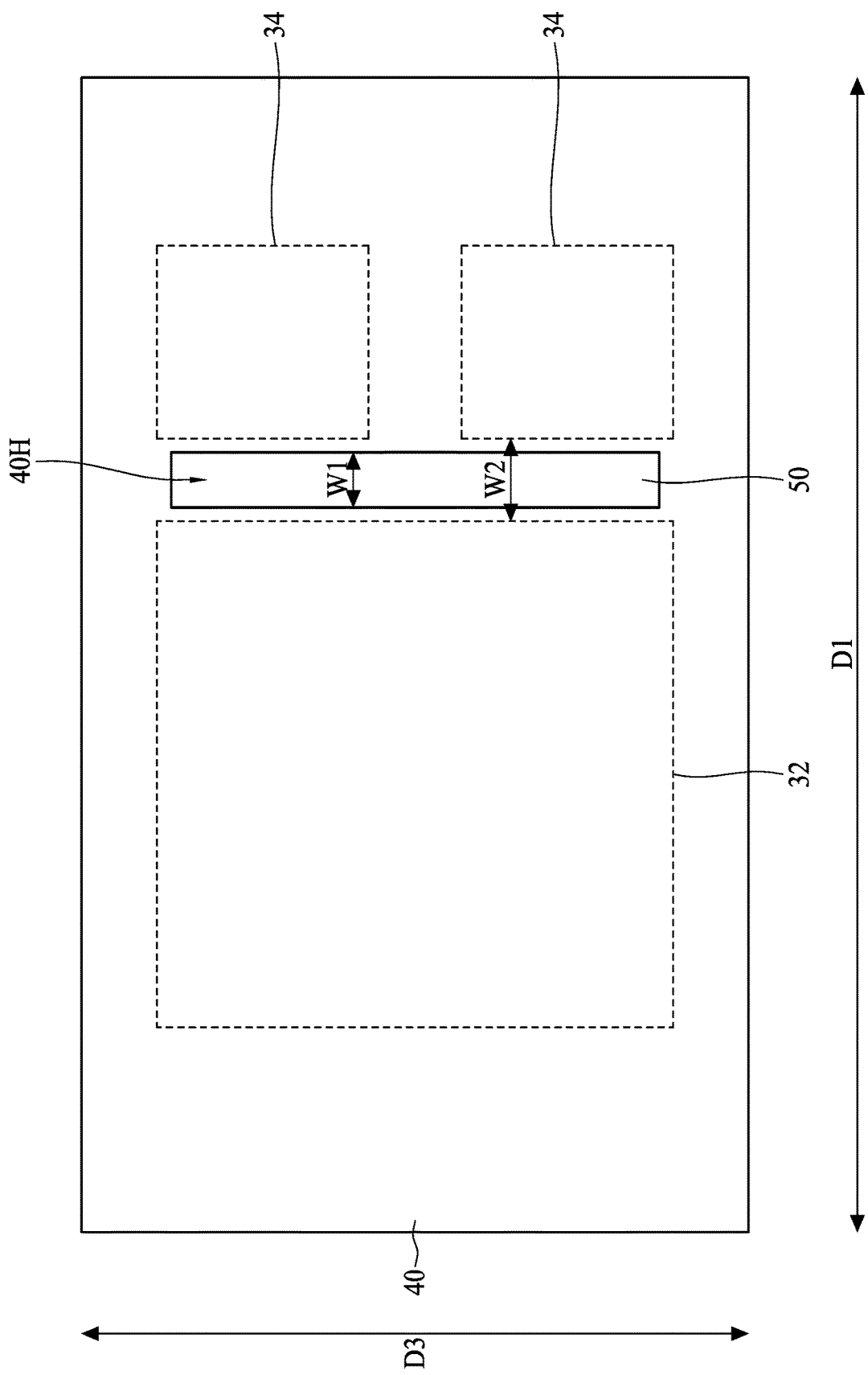
FIG. 2 is a top view of a semiconductor device package in accordance with some embodiments of the present disclosure.

FIG. 1 is a cross-sectional view of a semiconductor device package 1 in accordance with some embodiments of the present disclosure, and FIG. 2 is a top view of a semiconductor device package 1 in accordance with some embodiments of the present disclosure. As shown in FIG. 1 and FIG. 2, the semiconductor device package 1 includes a substrate 10, a plurality of electronic components such as one or more electronic components 32 and one or more electronic components 34, a heat dissipation lid 40 and thermal isolation 50. The substrate 10 has a surface 10A, and another surface 10B opposite to the surface 10A. In some embodiments, the surface 10A is substantially parallel to the surface 10B. In some embodiments, the substrate 10 may include a printed circuit board or the like. One or more circuit layers 12 may be disposed in the substrate 10 such that components disposed on the surface 10A and the surface 10B can be electrically connected through the circuit layers 12. In some embodiments, conductive structures 14 such as solder balls may be disposed on the surface 10B of the substrate 10 for external electrical connection.

The electronic component 32 and the electronic component 34 are disposed over the surface 10A of the substrate 10, and arranged along a direction D1 substantially parallel to the surface 10A. In some embodiments, the electronic component 32 and the electronic component 34 are disposed at substantially the same tier. The electronic component 32 and the electronic component 34 are different types of electronic components. The electronic component 32 and the electronic component 34 have different characteristics; for example, the power of the electronic component 12 is higher than the power of the electronic component 34. The high-power electronic component 32 generates more heat during operation, resulting in higher temperatures, while the low-power electronic component 34 generates less heat than the high-power electronic component 34 during operation, resulting in lower temperatures. The electronic component 34 may be vulnerable to high temperatures, and tends to be damaged when the temperature rises above its proper operational temperature. In some embodiments, the electronic component 32 may be an application-specific integrated circuit (ASIC) or the like, and the electronic component 34 is a memory chip such as a high-bandwidth memory (HBM) chip or the like. The electronic component 32 and the electronic component 34 are separated by a space 36 therebetween, to prevent the electronic component 32 from coming into contact with the electronic component 34, thus attenuating heat transfer between the electronic component 32 and the electronic component 34 in the direction D1.

In some embodiments, an interposer 20 such as a silicon interposer may be disposed between the substrate 10 and the electronic components 32/34. The interposer 20 may include conductive vias 22 such as through silicon vias (TSVs), and the electronic components 32/34 can be electrically connected to the substrate 10 through the interposer 20. In some embodiments, conductive structures 24 such as solder bumps can be disposed between the interposer 20 and the substrate 10 to electrically connect the interposer 20 to the substrate 10. An underfill 26 may be disposed between the interposer 20 and the substrate 10 to encapsulate and protect the conductive structures 24.

In some embodiments, the electronic component 32 and the electronic component 34 may be electrically connected to the interposer 20 by flip chip bonding (FCP) techniques. The semiconductor device package 1 may further include conductive structures 32A to electrically connect the electronic component 32 with the interposer 20, and conductive structures 34A to electrically connect the electronic component 34 with the interposer 20. The conductive structures 32A and the conductive structures 34A may individually include conductive pads, solder bumps, conductive pillars or combinations thereof. In some embodiments, an underfill 32B can be disposed between electronic component 32 and the interposer 20 to encapsulate and protect the conductive structures 32A. Another underfill 34B can be disposed between electronic component 34 and the interposer 20 to encapsulate and protect the conductive structures 34A.

The heat dissipation lid 40 is disposed over the electronic components 32/34. The heat dissipation lid 40 includes a bottom surface 40B facing the electronic components 32/34 and an upper surface 40A opposite to the bottom surface 40B. In some embodiments, a ring structure 42 can be disposed over the surface 10A of the substrate 10. The ring structure 42 may be disposed at a peripheral region of the substrate 10, and surrounds the interposer 20 and the electronic components 32/34. In some embodiments, the ring structure 42 is attached to the substrate 20 by an adhesive layer 44. The heat dissipation lid 40 may be attached to the ring structure 42 by another adhesive layer 46. The heat dissipation lid 40 is configured to provide a heat dissipation path along a direction D2 substantially perpendicular to the surface 10A of the substrate 10 to dissipate the heat generated by the electronic components 32/34 during operation. The material of the heat dissipation lid 40 includes highly thermal conductive material. In some embodiments, the thermal conductivity of the material of the heat dissipation lid 40 is higher than, but not limited to, 200 watts per meter per Kelvin (W/m*K). By way of example, the material of the heat dissipation lid 40 may include metal or metal alloy such as aluminum (Al) having a thermal conductivity of about 210 W/m*K, copper (Cu) having a thermal conductivity of about 390 W/m*K, an alloy thereof, or the like. In some embodiments, the ring structure 42 may also be configured to provide a heat dissipation path along the direction D1 to dissipate the heat generated by the electronic components 32/34 during operation. The material of the heat dissipation lid 40 and the ring structure 42 may be the same or different. The heat dissipation lid 40 includes one or more apertures 40H at least over the space 36 between the electronic component 32 and the electronic component 34.

In some embodiments, the heat dissipation lid 40 is separated from the electronic component 32 and the electronic component 34. For example, a gap between the heat dissipation lid 40 and the electronic components 32/34 ranges from about 1 micrometer to about 200 micrometers, or ranging from about 1 micrometer to about 100 micrometers, but is not limited thereto.

The semiconductor device package 1 further includes thermal isolation 50 in the one or more apertures 40H of the heat dissipation lid 40. The thermal conductivity of the heat dissipation lid 40 is higher than the thermal conductivity of the thermal isolation 50. By way of example, the ratio of the thermal conductivity of the heat dissipation lid 40 to the thermal conductivity of the thermal isolation 50 exceeds 30, exceeds 50 or is even higher. The thermal isolation 50 is configured to mitigate heat transfer in the heat dissipation lid 40 along the direction D1. For example, when the electronic component 32 generates a higher temperature than the electronic component 34, the temperature of the portion of the heat dissipation lid 40 right over the electronic component 32 will be higher than another portion of the heat dissipation lid 40 right over the electronic component 34. The thermal isolation 50 in the aperture 40H can help to prevent heat transfer between the portions of the heat dissipation lid 40 on opposing sides of the aperture 40H. Accordingly, the electronic component 32 and the electronic component 34 can be individually maintained within their proper operational temperature range. The combination of the heat dissipation lid 40 and the thermal isolation 50 also helps to contain the thermal resistance of the semiconductor device package 1 within its proper range. In some embodiments, the thermal isolation 50 includes gas state thermal isolation. By way of example, the gas state thermal isolation may include an air thermal isolation having a thermal conductivity of about 0.026 W/m*K. In some embodiments, the one or more apertures 40H can be sealed and gases can be pumped out to form vacuum thermal isolation.

As shown in FIG. 2, the aperture 40H may include a substantially rectangular aperture extending along a direction D3 perpendicular to the direction D1. The aperture 40H of the heat dissipation lid 40 has a width W1 measured in the direction D1, and the space 36 has a width W2 measured in the direction D1. In some embodiments, the ratio of the width W1 to the width W2 is greater than 50%. By way of example, the width W1 of the aperture 40H is about 2 millimeters, and the width W2 of the space 36 ranges from about 2 millimeters to about 4 micrometers.

The heat dissipation lid 40 made from highly thermally conductive material provides a short and quick thermal dissipation path along the vertical direction for the electronic components 32/34, and thus the heat generated by the electronic components 32/34 can be transferred upwards to allow the cooling of the electronic components 32/34. The thermal isolation 50, on the other hand, disposed in the aperture 40H of the heat dissipation lid 40, is made of a material with low thermal conductivity, and it mitigates heat transfer in the heat dissipation lid 40 along the lateral direction. The thermal isolation 50 can help to prevent a rise in the temperature of the low-power electronic component 34 by blocking heat transfer in the heat dissipation lid 40 along the lateral direction.

Semiconductor device packages provided for by the present disclosure are not limited to the above-described embodiments, and may include other, different embodiments, such as those described below. To simplify the description and for convenient comparison between each of the embodiments of the present disclosure, the same or similar components in each of the following embodiments are marked with the same numerals and are not redundantly described.

Figure 3A:
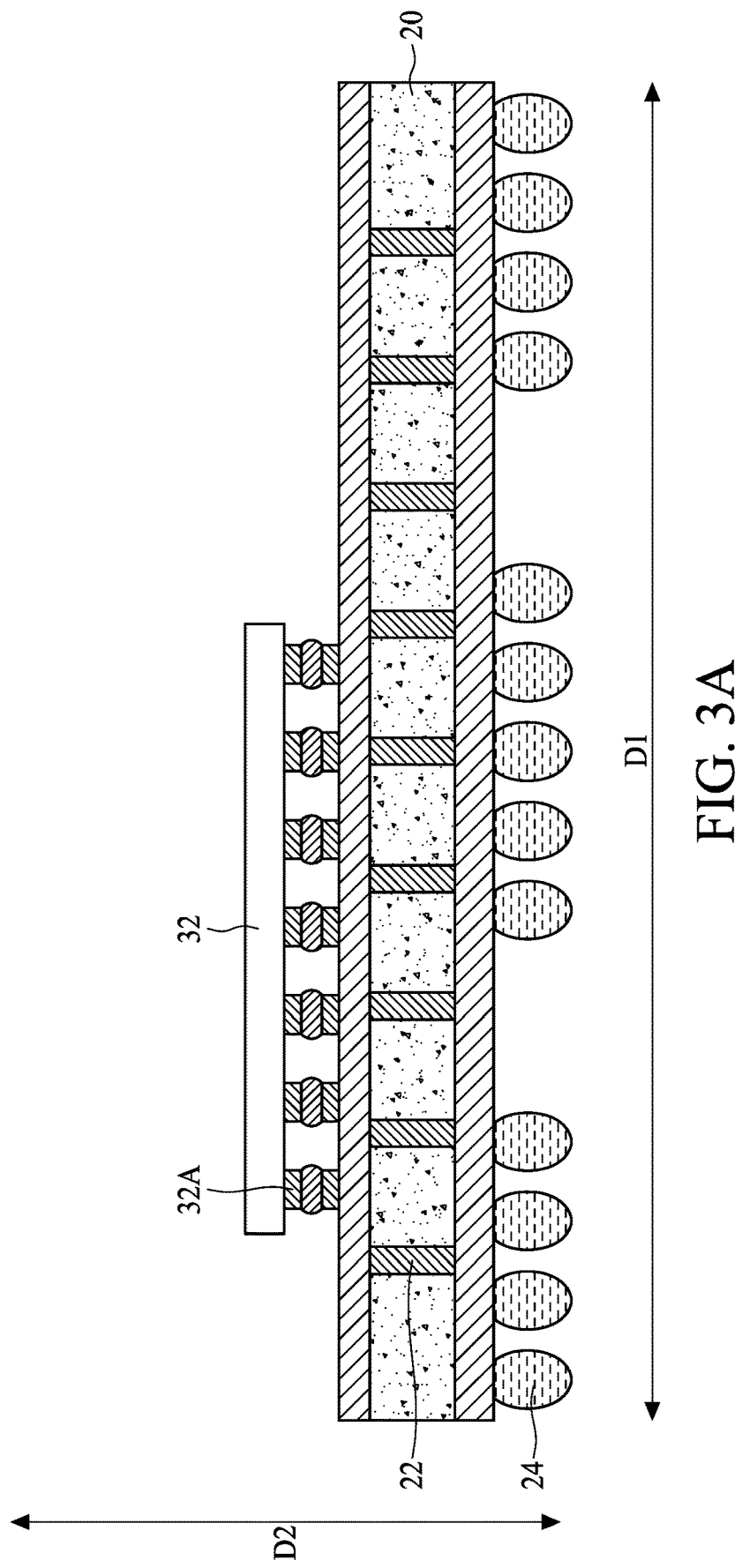
FIG. 3A, FIG. 3B, FIG. 3C, FIG. 3D and FIG. 3E are schematic diagrams illustrating a method of fabricating a semiconductor device package in accordance with some embodiments of the present disclosure.
Figure 3B:
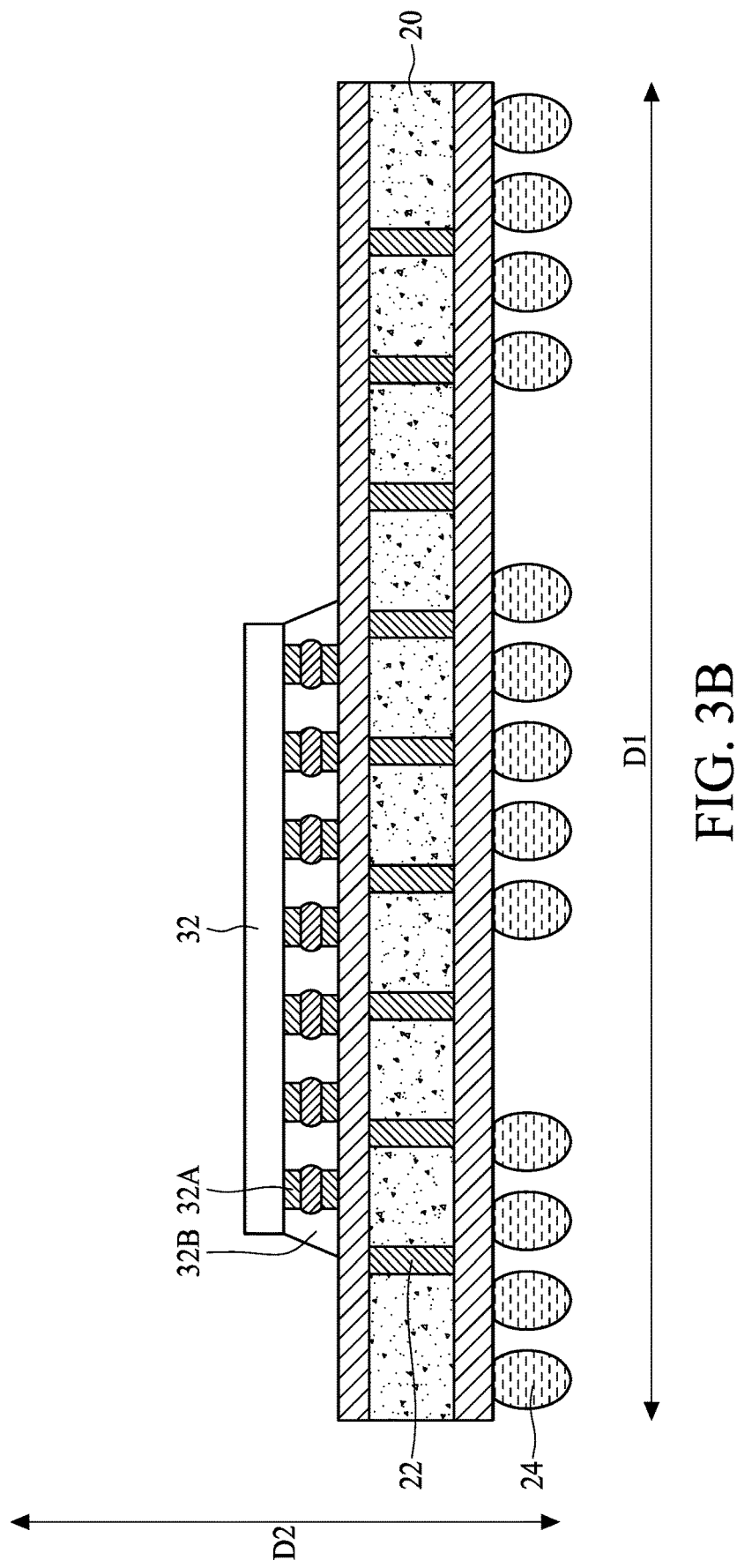

FIG. 3A, FIG. 3B, FIG. 3C, FIG. 3D and FIG. 3E are schematic diagrams illustrating a method of fabricating a semiconductor device package in accordance with some embodiments of the present disclosure. As shown in FIG. 3A, an interposer 20 is received. One or more electronic components 32 are bonded to a surface of the interposer 20. In some embodiments, conductive structures 24 such as solder bumps can be disposed on the other surface of the interposer 20, and the interposer 20 can be bonded to another component through the conductive structures 24. In some embodiments, the electronic component 32 is bonded to the interposer 20 by flip chip bonding (FCB) technique and electrically connected to the conductive vias 22 of the interposer 20 through conductive structures 32A such as conductive pads, solder bumps, conductive pillars or combinations thereof. As shown in FIG. 3B, an underfill 32B is dispensed between the electronic component 32 and the interposer 20, and cured.

Figure 3C:
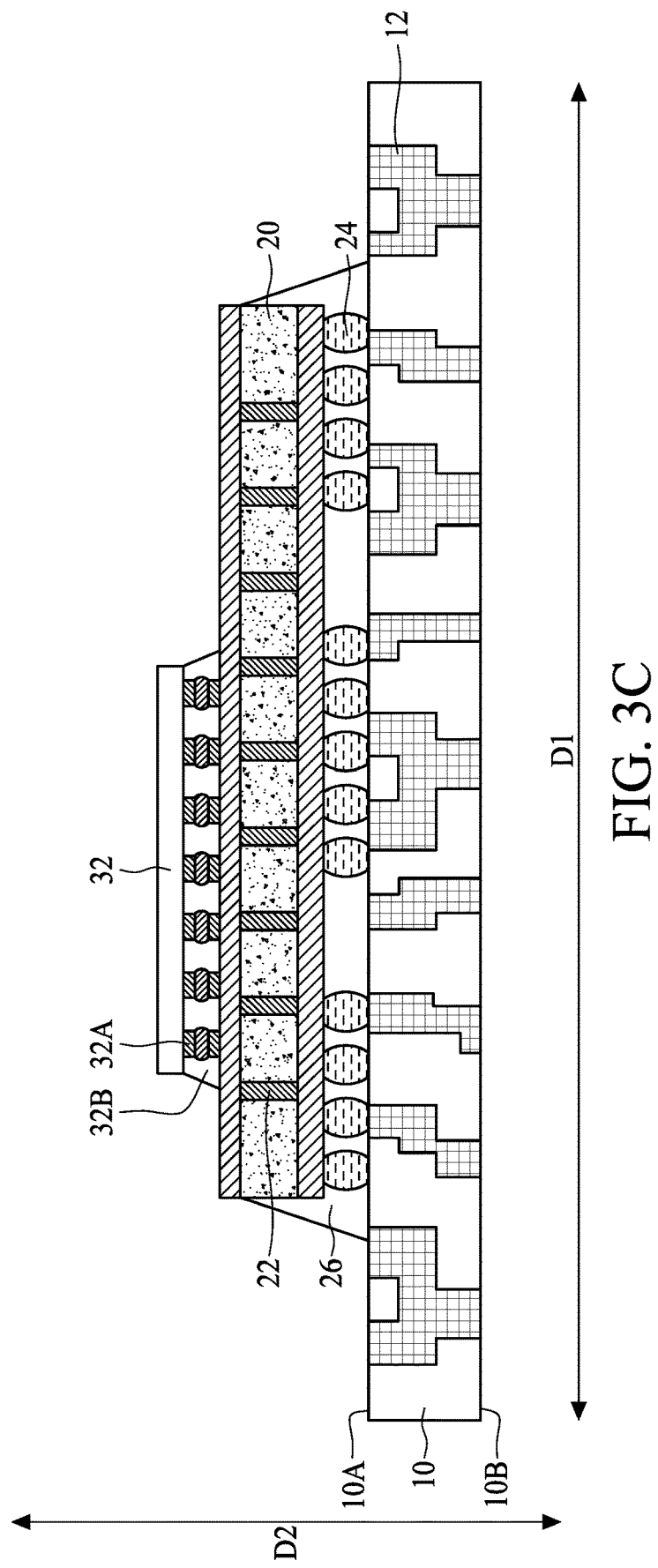
Figure 3D:
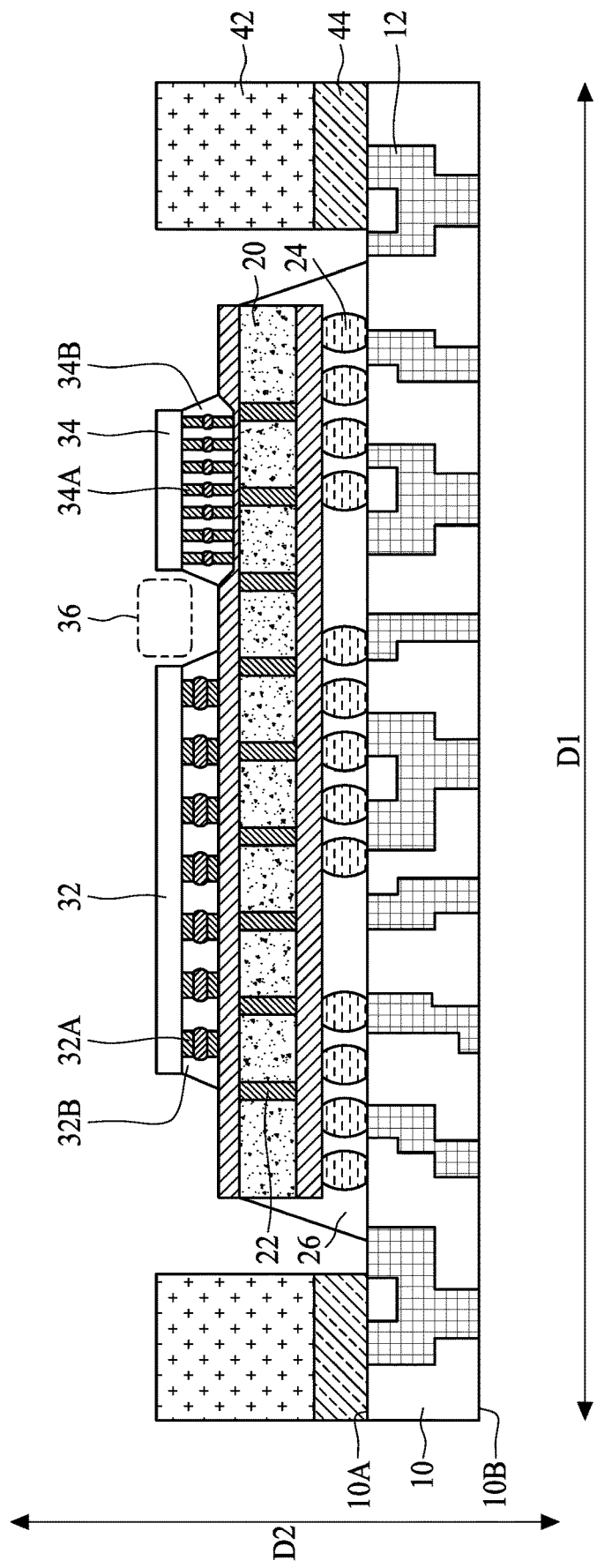

As shown in FIG. 3C, the interposer 20 is bonded to a substrate 10 such as a printed circuit board via the other surface. Another underfill 26 is dispensed between the interposer 20 and the substrate 10, and cured. As shown in FIG. 3D, a ring structure 42 is attached to the substrate 10 with an adhesive layer 44. One or more electronic components 34 are bonded to the surface of the interposer 20. In some embodiments, the electronic component 34 is bonded to the interposer 20 by FCB technique, and electrically connected to the conductive vias 22 of the interposer 20 through conductive structures 34A such as conductive pads, solder bumps, conductive pillars or combinations thereof. An underfill 34B is dispensed between the electronic component 34 and the interposer 20, and cured. The electronic component 32 and the electronic component 34 are separated by a space 36. In some embodiments, the electronic component 34 may be bonded to the interposer 20 along with the electronic component 32. In some embodiments, the electronic component 32 and the electronic component 34 may be leveled, for example, an upper surface of the electronic component 32 and an upper surface of the electronic component 34 may be substantially leveled.

Figure 3E:
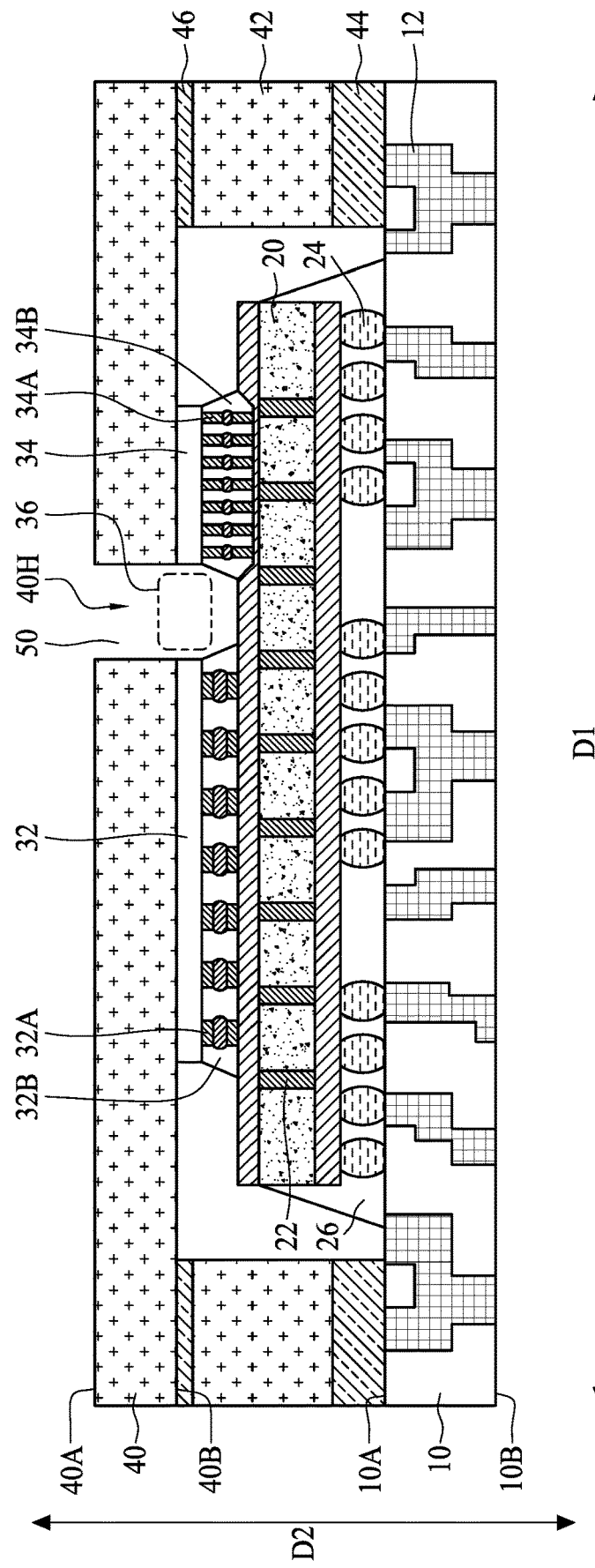

As shown in FIG. 3E, a heat dissipation lid 40 is attached to the ring structure 42 with an adhesive layer 46. The heat dissipation lid 40 includes one or more apertures 40H. Thermal isolation 50 is formed in the one or more apertures 40H. The thermal isolation 50 may include gas state thermal isolation, solid state thermal isolation, vacuum thermal isolation, or a combination thereof. In some embodiments, conductive structures 14 such as solder balls may be formed on the surface 10B of the substrate 10 to form a semiconductor device package 1 as illustrated in FIG. 1 and FIG. 2.

Figure 4:
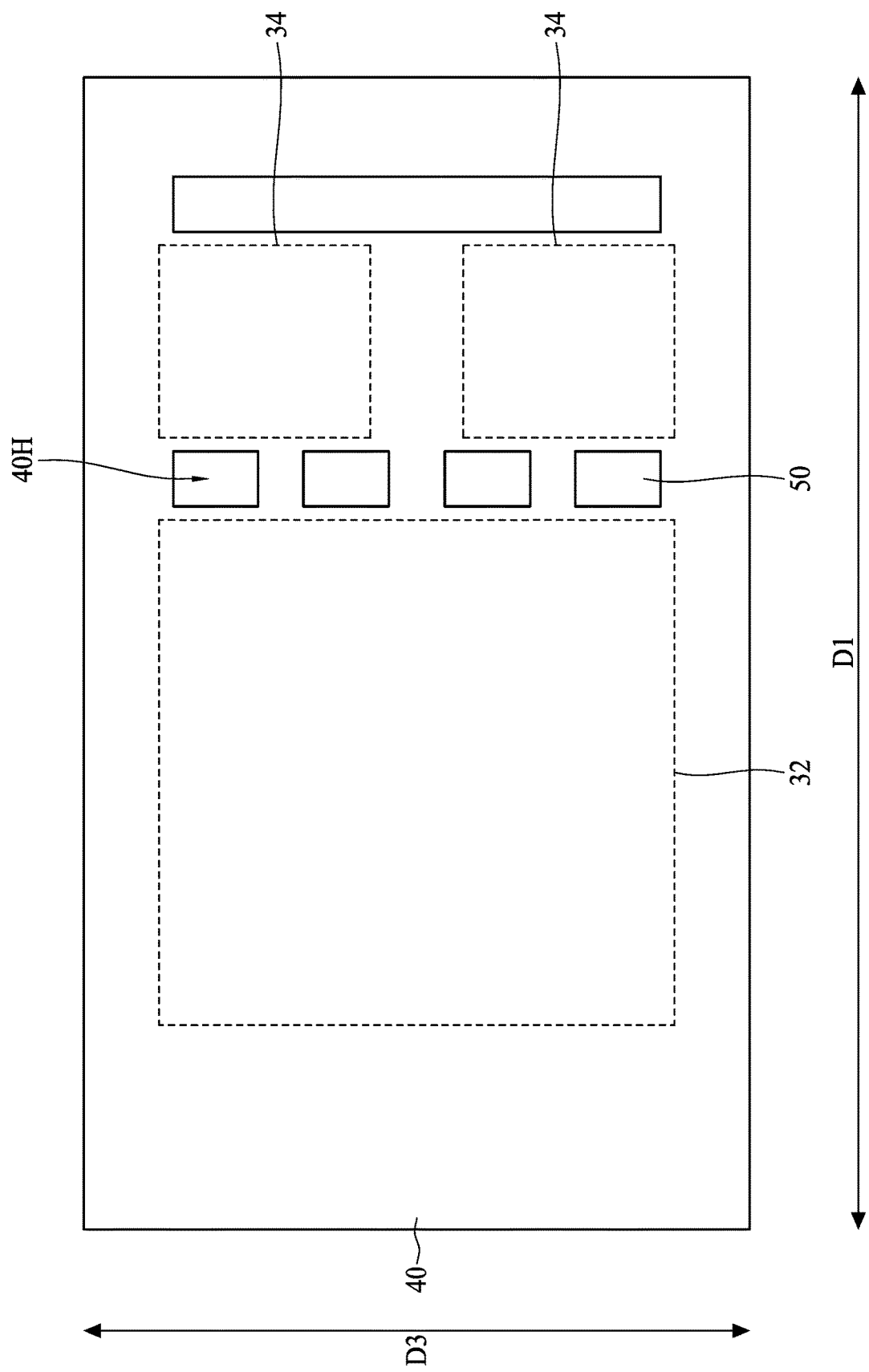
FIG. 4 is a top view of a semiconductor device package in accordance with some embodiments of the present disclosure.

FIG. 4 is a top view of a semiconductor device package 2 in accordance with some embodiments of the present disclosure. As shown in FIG. 4, the heat dissipation lid 40 includes several apertures 40H over the space 36 between the electronic component 32 and the electronic component 34. The apertures 40H may be disconnected from one another, and arranged substantially along the direction D3. The thermal isolation 50 may be disposed in each of the apertures 40H of the heat dissipation lid 40.

Figure 5:
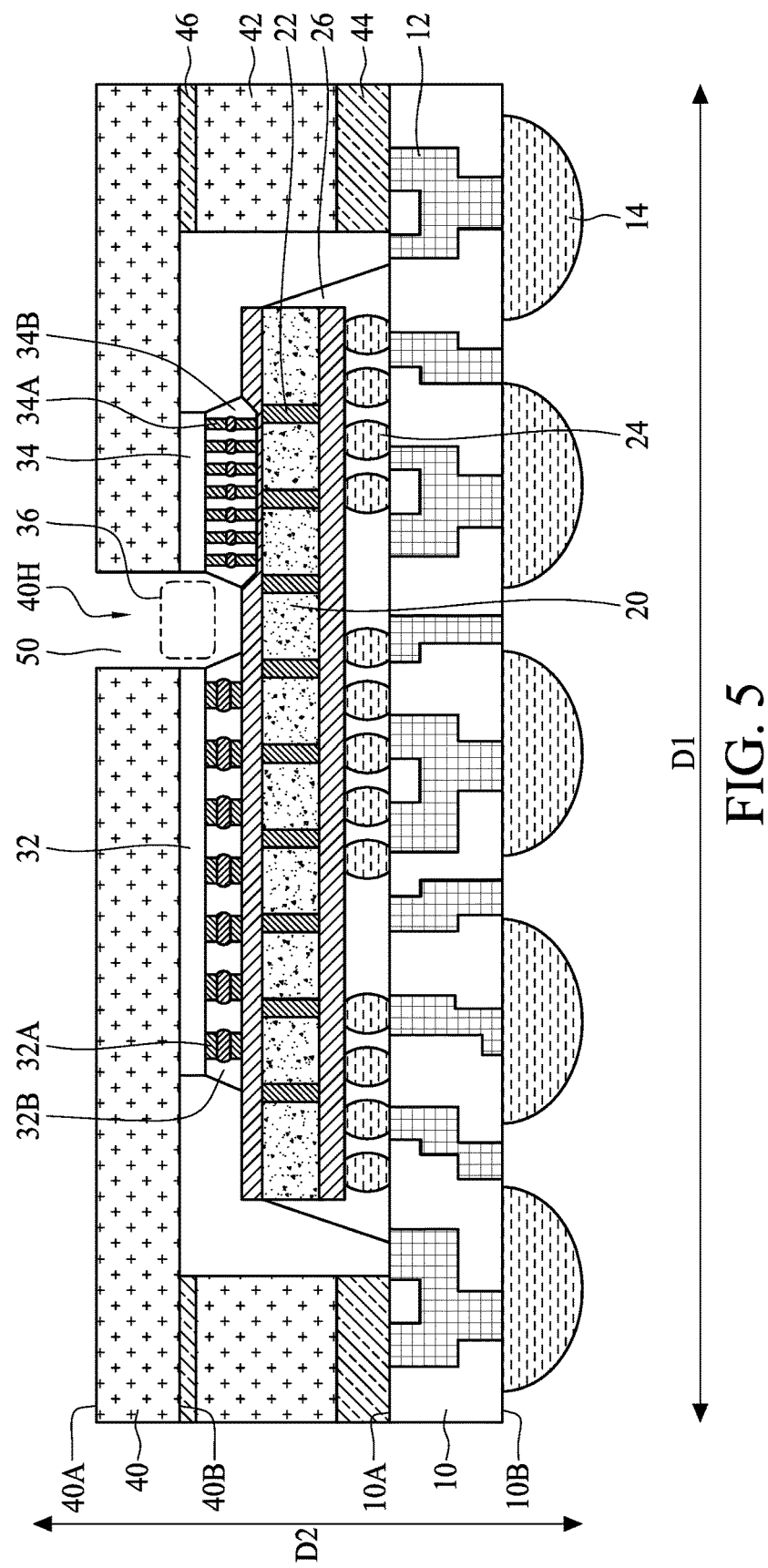
FIG. 5 is a cross-sectional view of a semiconductor device package in accordance with some embodiments of the present disclosure.

FIG. 5 is a cross-sectional view of a semiconductor device package 3 in accordance with some embodiments of the present disclosure. As shown in FIG. 5, the heat dissipation lid 40 may be in contact with the electronic component 32 and/or the electronic component 34. The contact between the heat dissipation lid 40 and the electronic components 32/34 provides a shorter and direct thermal dissipation path along the vertical direction, and thus the heat generated by the electronic components 32/34 can be transferred upwards and facilitate the cooling of the electronic components 32/34. The thermal isolation 50 disposed in the one or more apertures 40H can mitigate heat transfer in the heat dissipation lid 40 along the direction D1 (lateral direction).

Figure 6:
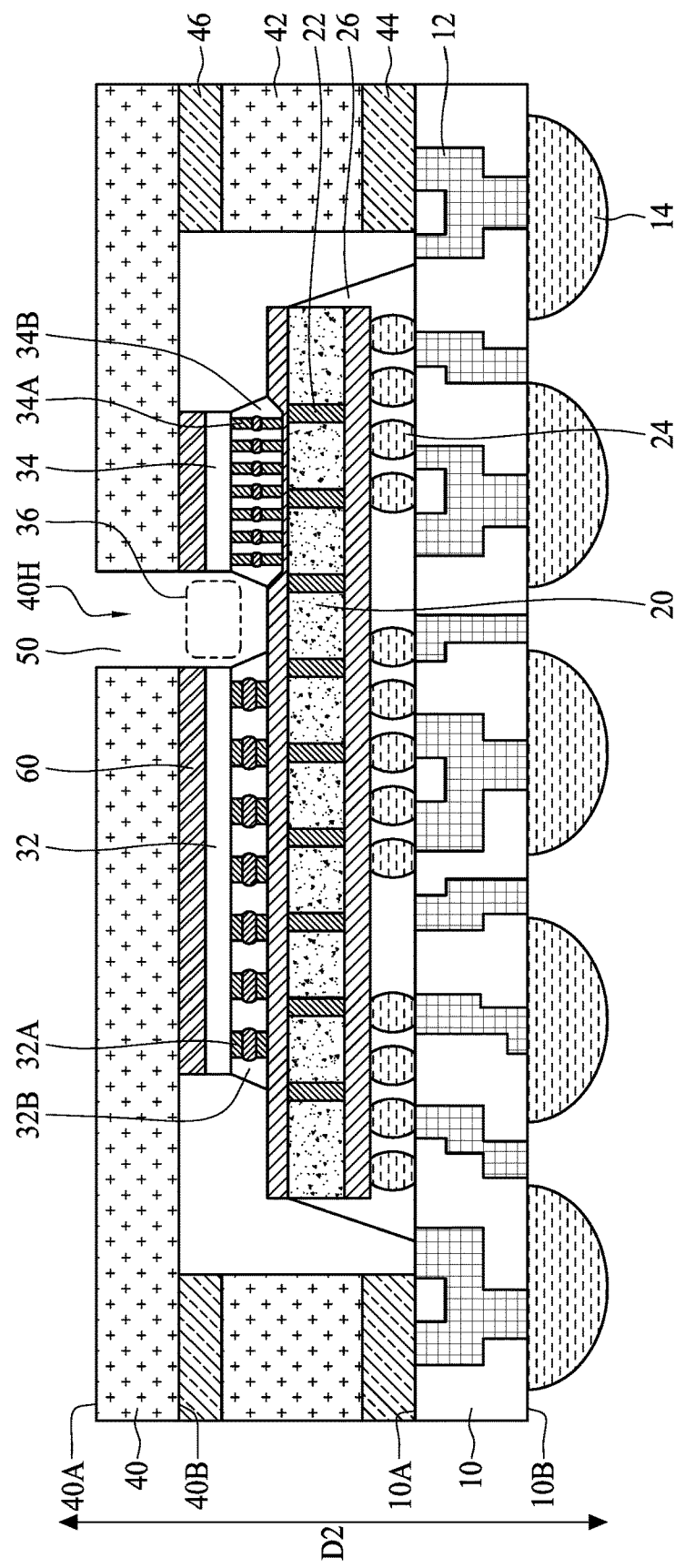
FIG. 6 is a cross-sectional view of a semiconductor device package in accordance with some embodiments of the present disclosure.

FIG. 6 is a cross-sectional view of a semiconductor device package 4 in accordance with some embodiments of the present disclosure. As shown in FIG. 6, the semiconductor device package 4 includes a thermal interface material (TIM) 60 between the heat dissipation lid 40 and the electronic components 32/34.

The thermal conductivity of the thermal interface material 60 between the heat dissipation lid 40 and the electronic components 32/34 is higher than that of a medium such as air. The thermal interface material 60 provides a more efficient thermal dissipation path along the direction D2 (vertical direction), and thus the heat generated by the electronic components 32/34 can be transferred upwards to facilitate the cooling of the electronic components 32/34. The thermal isolation 50 disposed in the one or more apertures 40H can mitigate heat transfer in the heat dissipation lid 40 along the direction D1 (lateral direction).

Figure 7A:
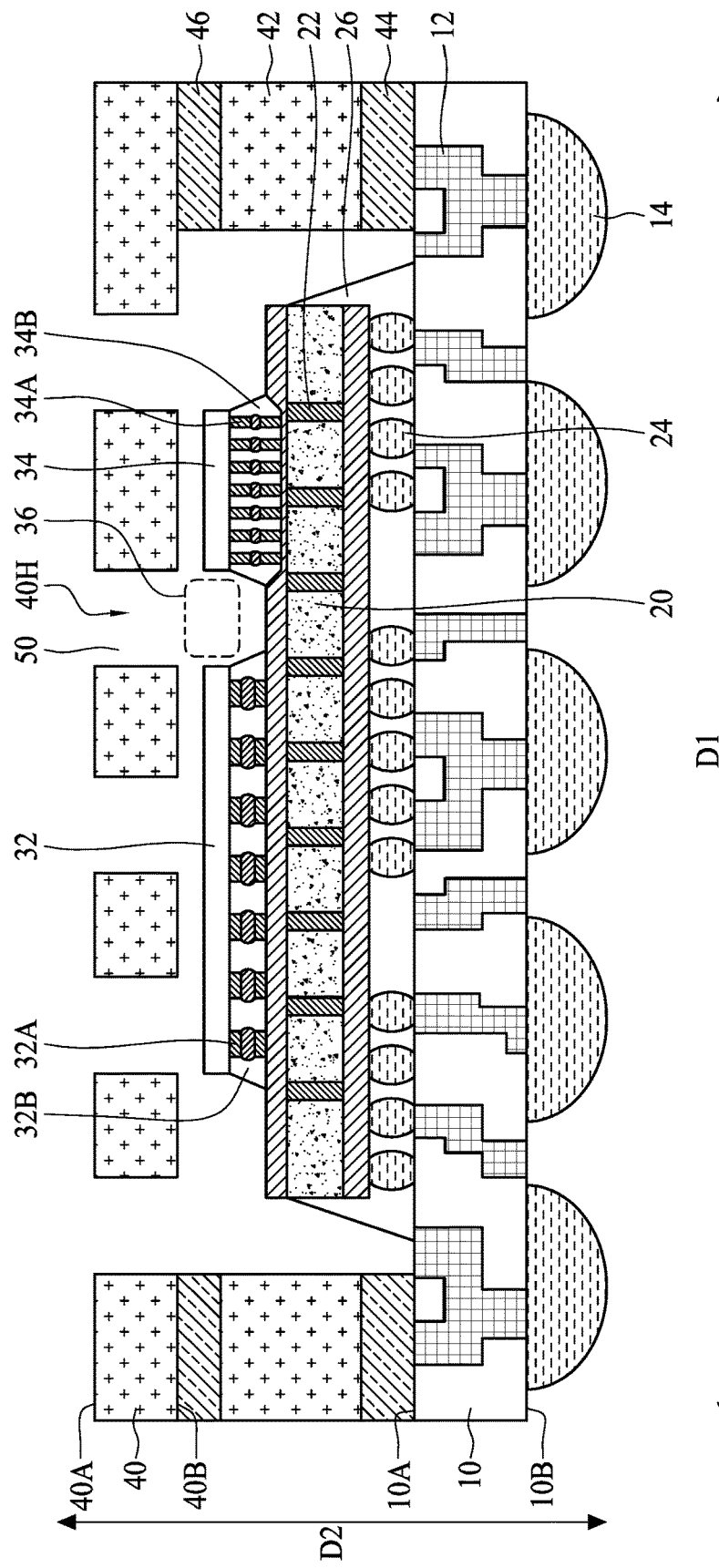
FIG. 7A is a cross-sectional view of a semiconductor device package in accordance with some embodiments of the present disclosure.
Figure 7B:
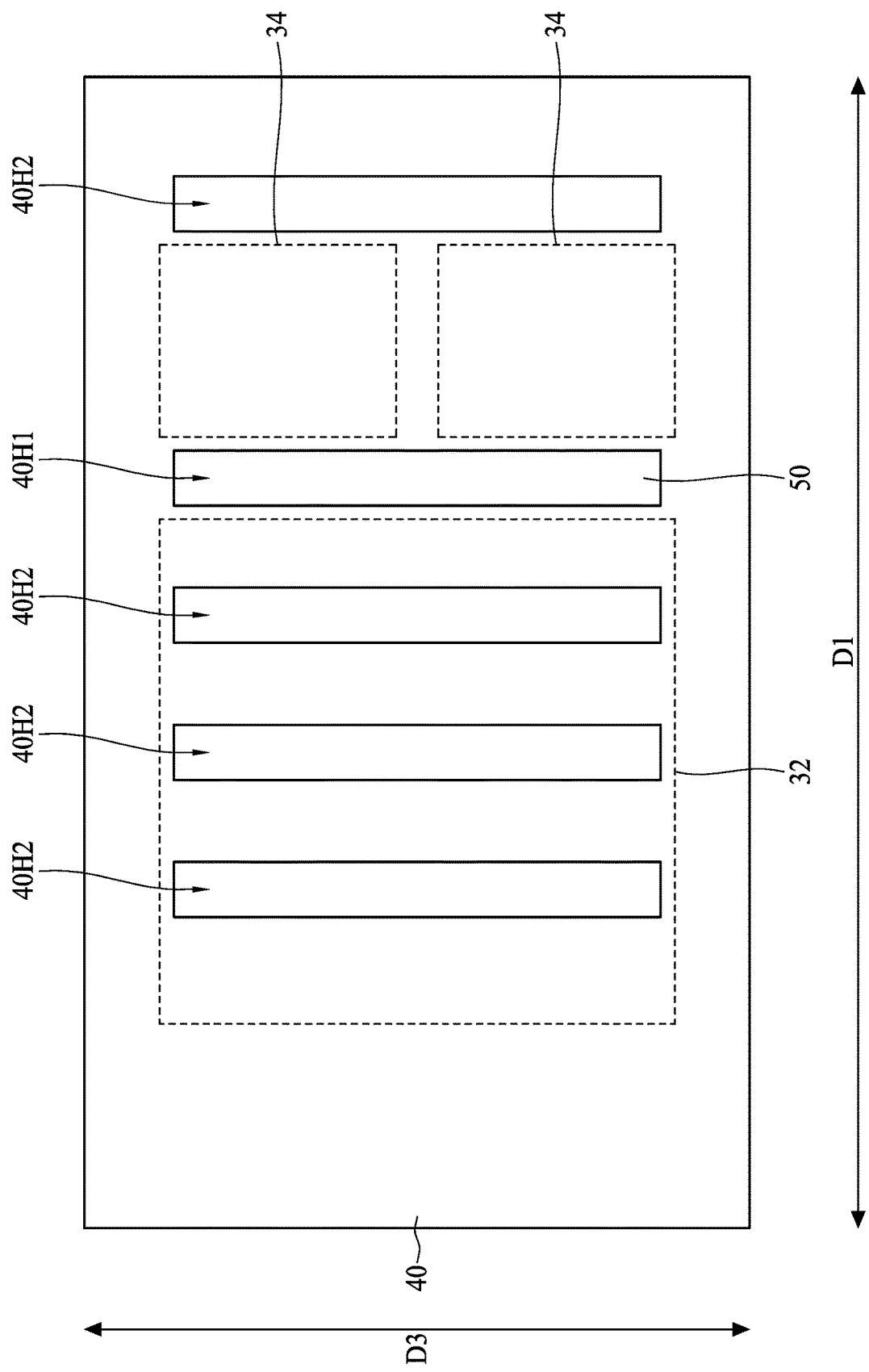
FIG. 7B is a top view of a semiconductor device package in accordance with some embodiments of the present disclosure.

FIG. 7A is a cross-sectional view of a semiconductor device package 5 in accordance with some embodiments of the present disclosure, and FIG. 7B is a top view of a semiconductor device package 5 in accordance with some embodiments of the present disclosure. As shown in FIG. 7A and FIG. 7B, the heat dissipation lid 40 has a plurality of apertures 40H including an aperture 40H1 substantially over the space 36 between the electronic component 32 and the electronic component 34, and one or more apertures 40H2 over the electronic component 32 and/or the electronic component 34. In some embodiments, the apertures 40H2 may overlap the electronic components 32/34, partially overlap the electronic components 32/34, or misalign with the electronic components 32/34. In some embodiments, the apertures 40H1/40H2 may be arranged along the direction D1. The apertures 40H1/40H2 may be, but are not limited to being, equally spaced in the direction D1. Each of the apertures 40H1/40H2 may extend along the direction D3. The size and shape of the apertures 40H1/40H2 may be, but are not limited to being, the same. For example, each of the apertures 40H1/40H2 may have a substantially rectangular shape or the like. The thermal isolation 50 is disposed in the 40H1/40H2 of the heat dissipation lid 40.

Figure 8A:
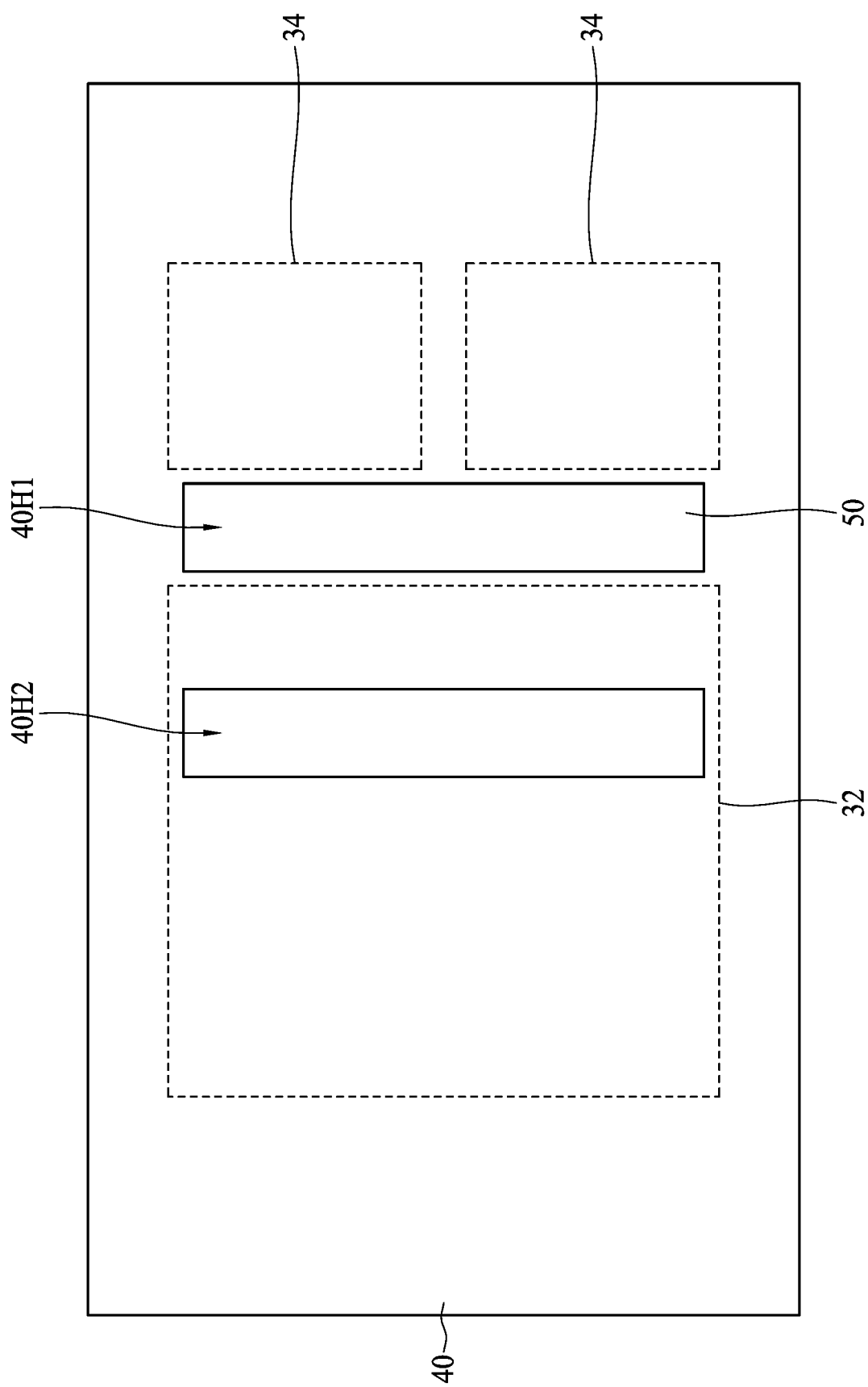
FIG. 8A, FIG. 8B and FIG. 8C are top views of semiconductor device packages in accordance with some embodiments of the present disclosure.
Figure 8B:
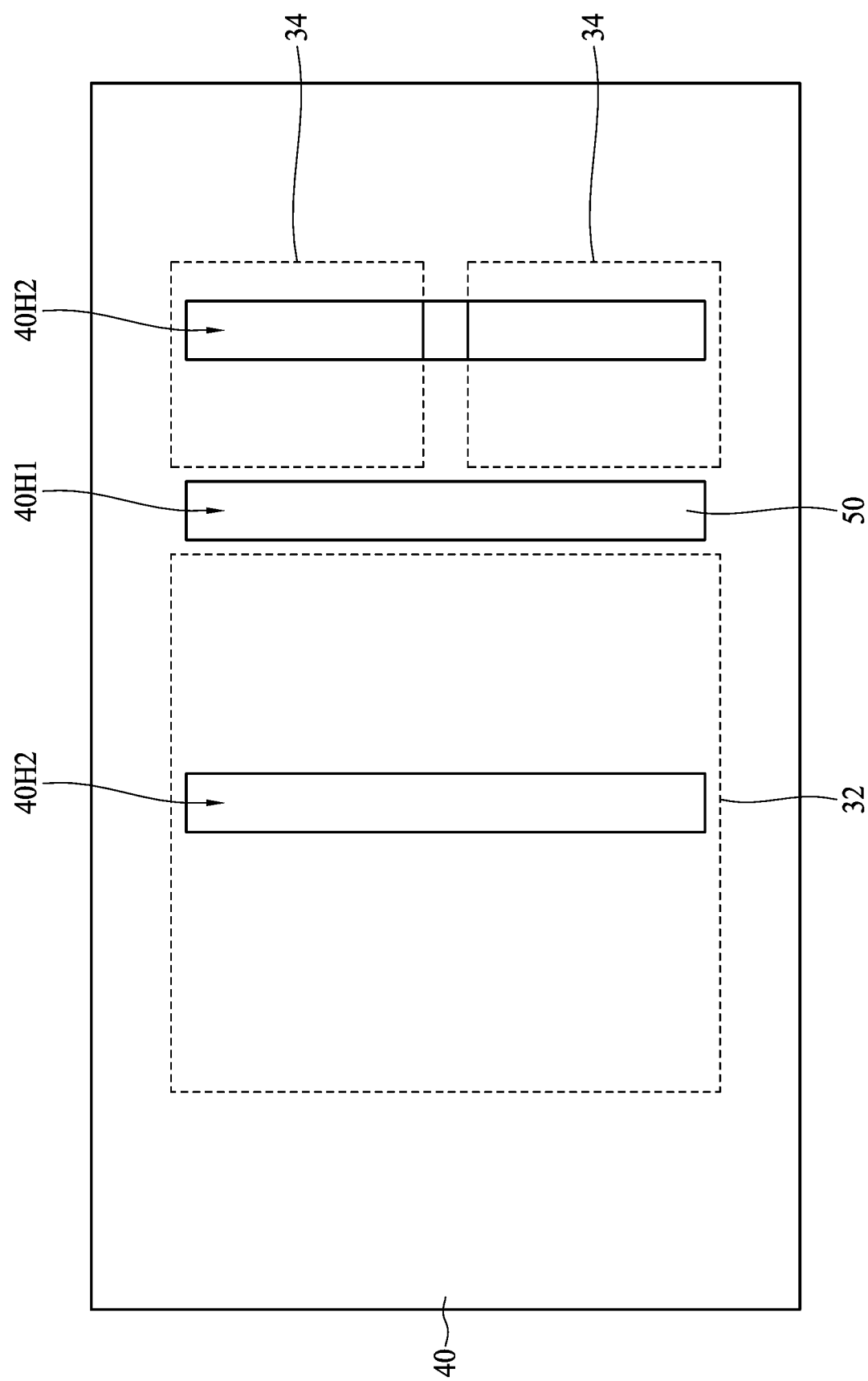
Figure 8C:
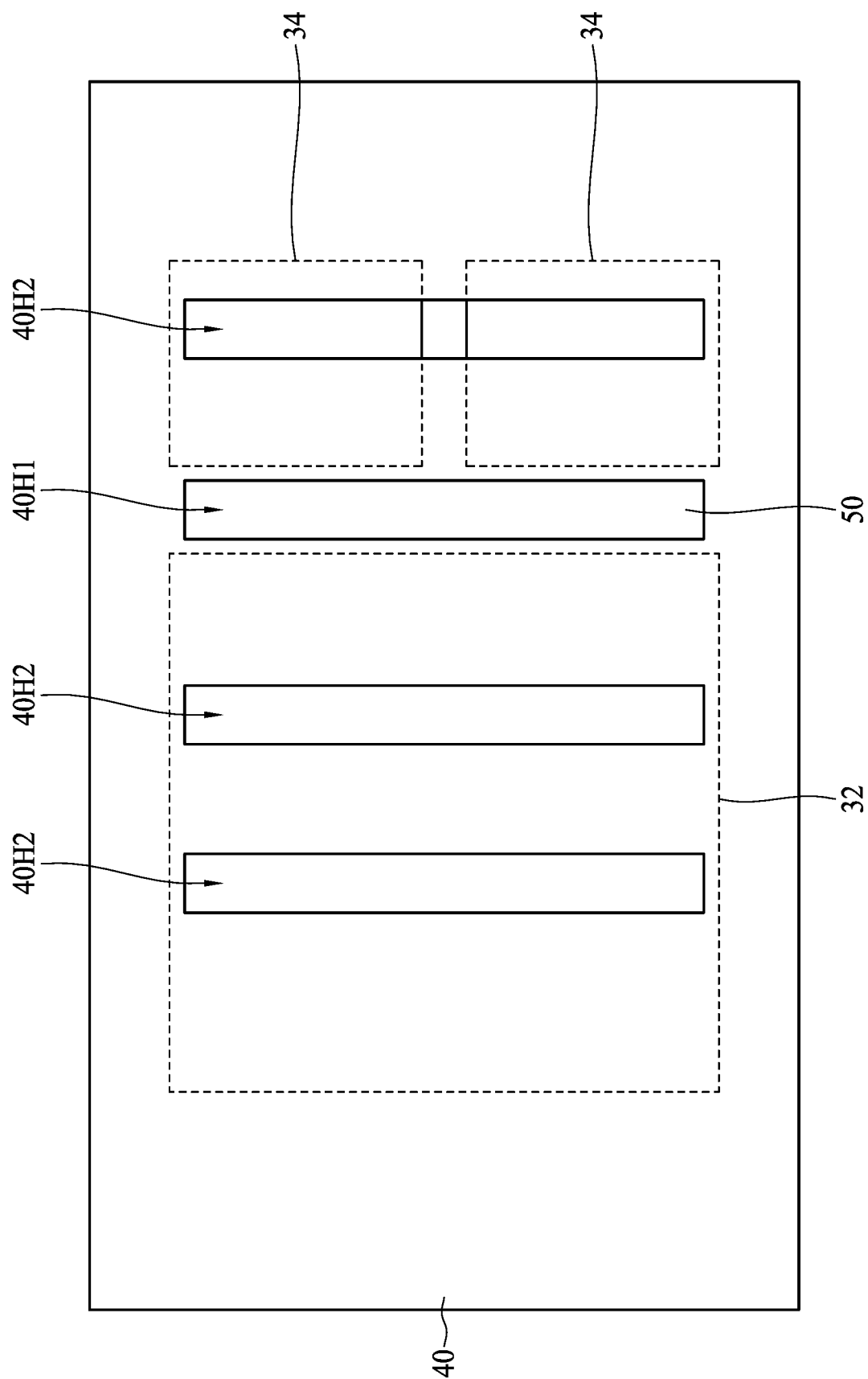

The number and location of the apertures 40H1/40H2 may be configured to enhance thermal isolation in the heat dissipation lid 40 along the direction D1 such that heat transfer along the direction D1 is mitigated. For example, one aperture 40H1 is formed in the heat dissipation lid 40 over the space 36, and four apertures 40H2 are formed in the heat dissipation lid 40 over or adjacent to the electronic components 32/34. In some other embodiments, the number and location of the apertures 40H1/40H2 may be modified. FIGS. 8A, 8B and 8C are top views of semiconductor device packages in accordance with some embodiments of the present disclosure. As shown in FIG. 8A, one aperture 40H1 is formed in the heat dissipation lid 40 over the space 36, and one aperture 40H2 is formed in the heat dissipation lid 40 over the electronic component 32. As shown in FIG. 8B, one aperture 40H1 is formed in the heat dissipation lid 40 over the space 36, and two apertures 40H2 are formed in the heat dissipation lid 40 over the electronic components 32/34. As shown in FIG. 8C, one aperture 40H1 is formed in the heat dissipation lid 40 over the space 36, and three apertures 40H2 are formed in the heat dissipation lid 40 over the electronic components 32/34.

In some embodiments, the aperture ratio of an area of the one or more apertures 40H to an area of the heat dissipation lid 40 (e.g. an area of a top surface of the heat dissipation lid 40, or of a bottom surface of the heat dissipation lid 40) substantially ranges from about 8% to about 53%. In some embodiments, the aperture ratio of the area of the one or more apertures 40H to the area of the heat dissipation lid 40 substantially ranges from about 8% to about 46%. In some embodiments, the aperture ratio of the area of the one or more apertures 40H to the area of the heat dissipation lid 40 substantially ranges from about 31% to about 53%. In some embodiments, the aperture ratio of the area of the one or more apertures 40H to the area of the heat dissipation lid 40 substantially ranges from about 31% to about 46%. The aperture ratio of the apertures 40H can be modified by increasing the area of apertures 40H and/or the number of the apertures 40H.

Figure 9:
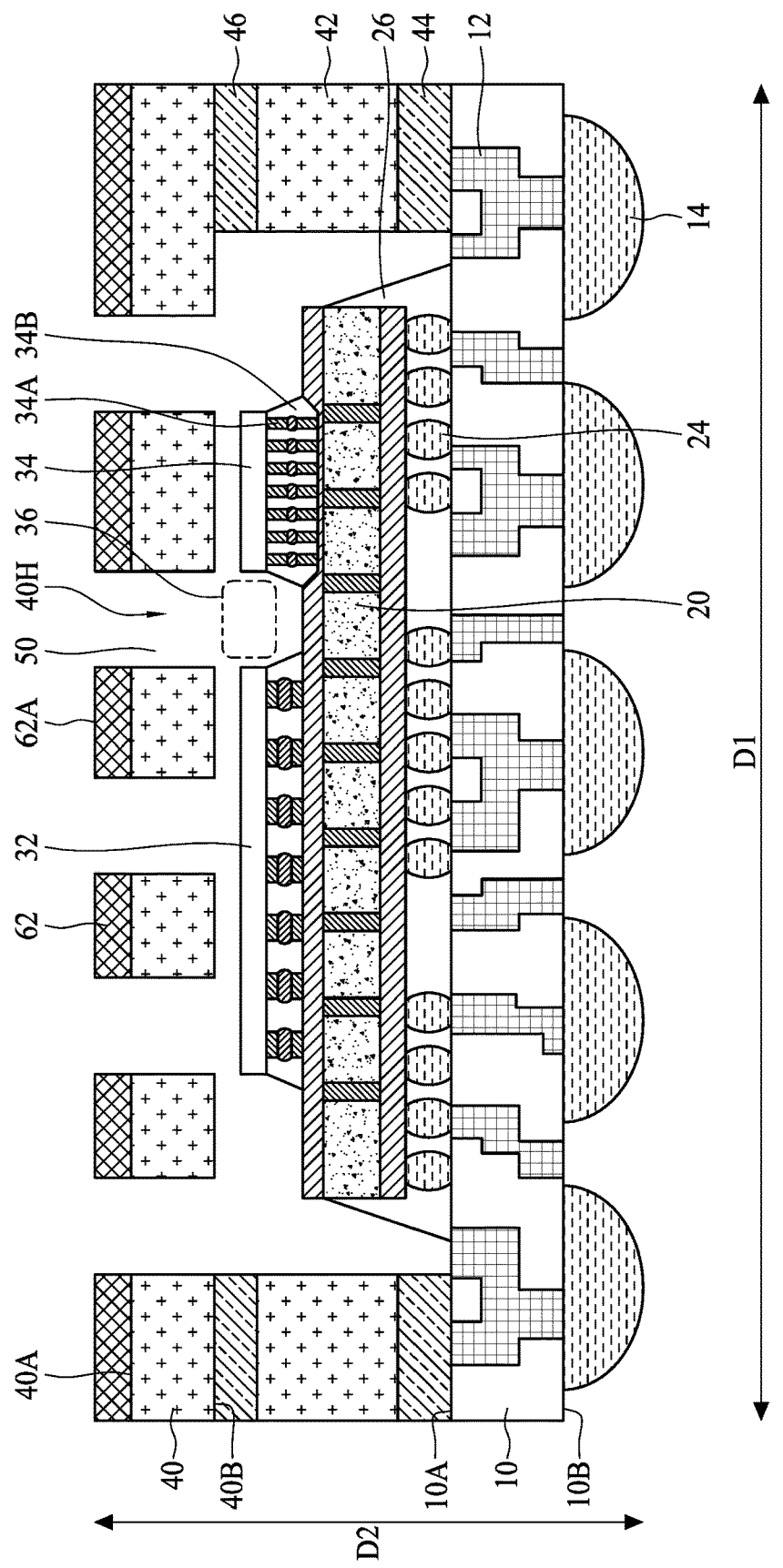
FIG. 9 is a cross-sectional view of a semiconductor device package in accordance with some embodiments of the present disclosure.

FIG. 9 is a cross-sectional view of a semiconductor device package 6 in accordance with some embodiments of the present disclosure. As shown in FIG. 9, the semiconductor device package 6 may further include a thermal interface material 62 on the heat dissipation lid 40. The thermal conductivity of the thermal interface material 62 is lower than the thermal conductivity of the heat dissipation lid 40. By way of example, the ratio of the thermal conductivity of the heat dissipation lid 40 to the thermal conductivity of the thermal interface material 62 is higher than 30. In some embodiments, the thermal interface material 62 covers an upper surface 40A of the heat dissipation lid 40. In some embodiments, the upper surface 62A of the thermal interface material 62 is substantially flat.

Figure 10:
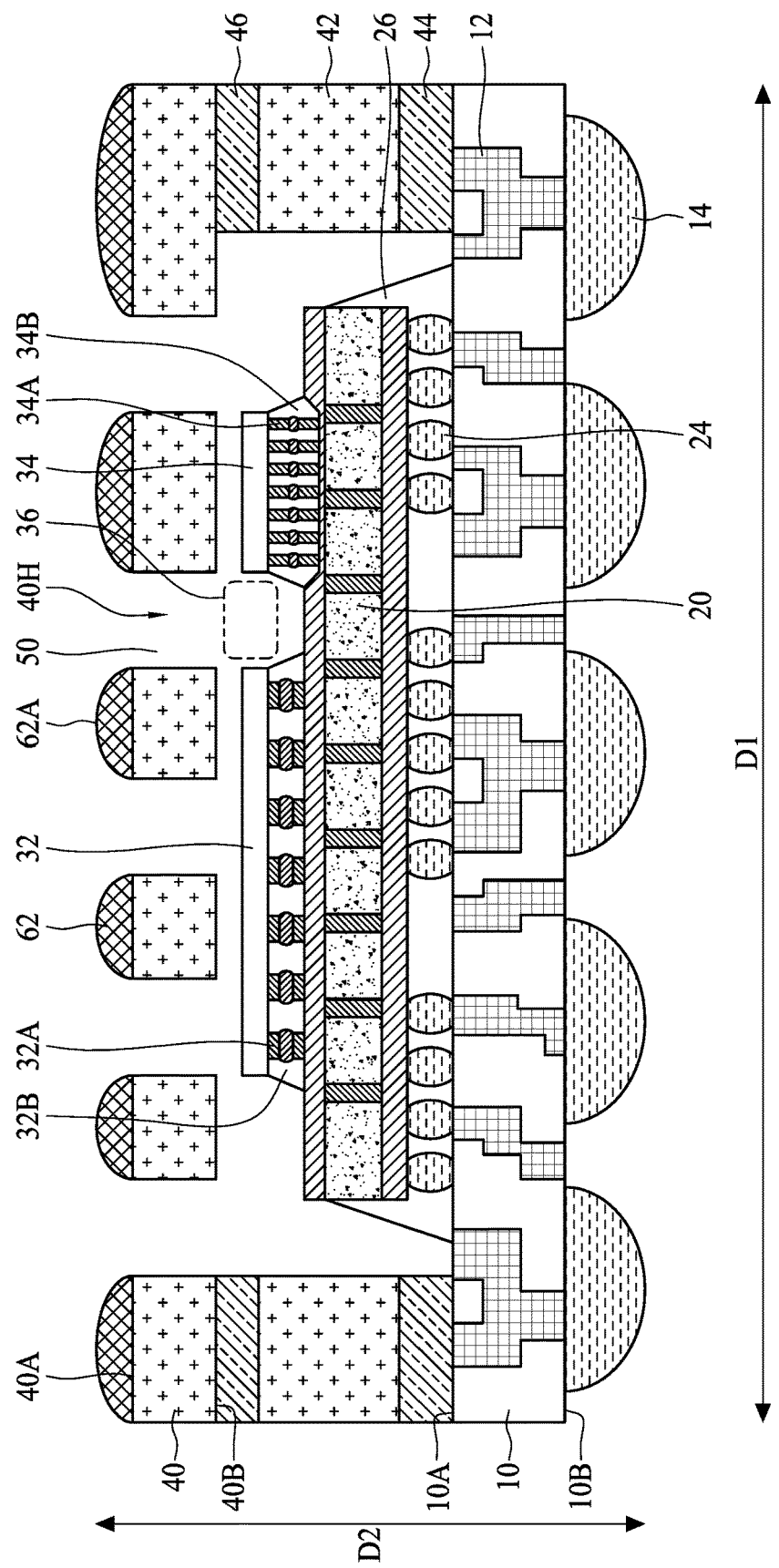
FIG. 10 is a cross-sectional view of a semiconductor device package in accordance with some embodiments of the present disclosure.

FIG. 10 is a cross-sectional view of a semiconductor device package 7 in accordance with some embodiments of the present disclosure. As shown in FIG. 10, in contrast to the semiconductor device package 6 of FIG. 9, the upper surface 62A of the thermal interface material 62 of the semiconductor device package 6 is curved.

Figure 11:
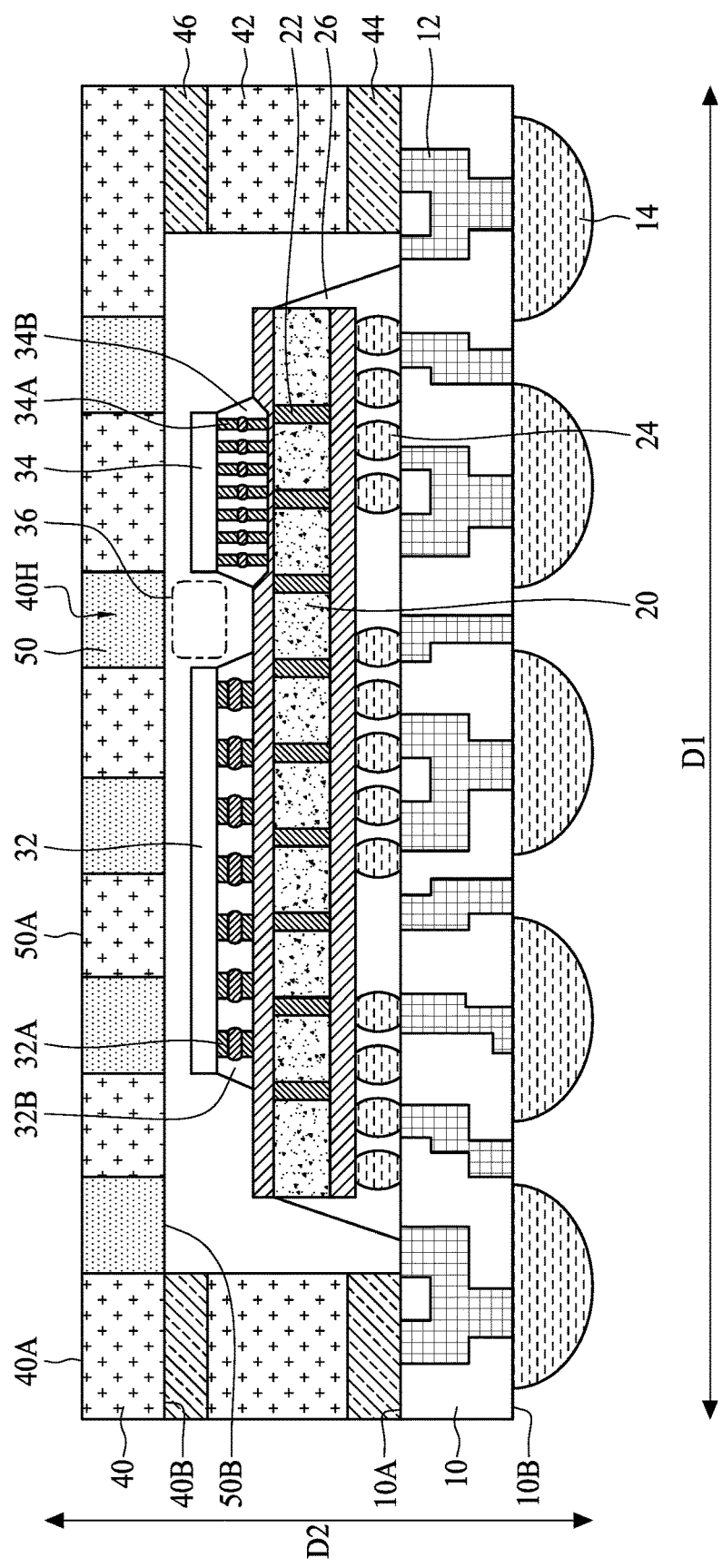
FIG. 11 is a cross-sectional view of a semiconductor device package in accordance with some embodiments of the present disclosure.

FIG. 11 is a cross-sectional view of a semiconductor device package 8 in accordance with some embodiments of the present disclosure. As shown in FIG. 11, the thermal isolation 50 includes solid state thermal isolation. The thermal conductivity of the thermal isolation 50 is lower than the thermal conductivity of the heat dissipation lid 40. By way of example, the ratio of the thermal conductivity of the heat dissipation lid 40 to the thermal conductivity of the thermal isolation 50 is higher than 30. In some embodiments, the solid state thermal isolation includes thermal interface material having a thermal conductivity less than about 10 W/m*K. In some embodiments, the thermal isolation 50 is disposed in the one or more apertures 40H. The thermal isolation 50 may be partially or fully disposed in the one or more apertures 40H. The thermal isolation 50 may be substantially leveled with the heat dissipation lid 40. For example, an upper surface 50A and/or a bottom surface 50B of the solid state thermal isolation 50 may be leveled with an upper surface 40A and/or a bottom surface 40B of the heat dissipation lid 40. In some embodiments, the thermal isolation 50 and the heat dissipation lid 40 may be set apart from the electronic components 32/34 with an air gap or a thermal interface material therebetween. In some embodiments, the thermal isolation 50 and the heat dissipation lid 40 may be in contact with the electronic components 32/34.

Figure 12:
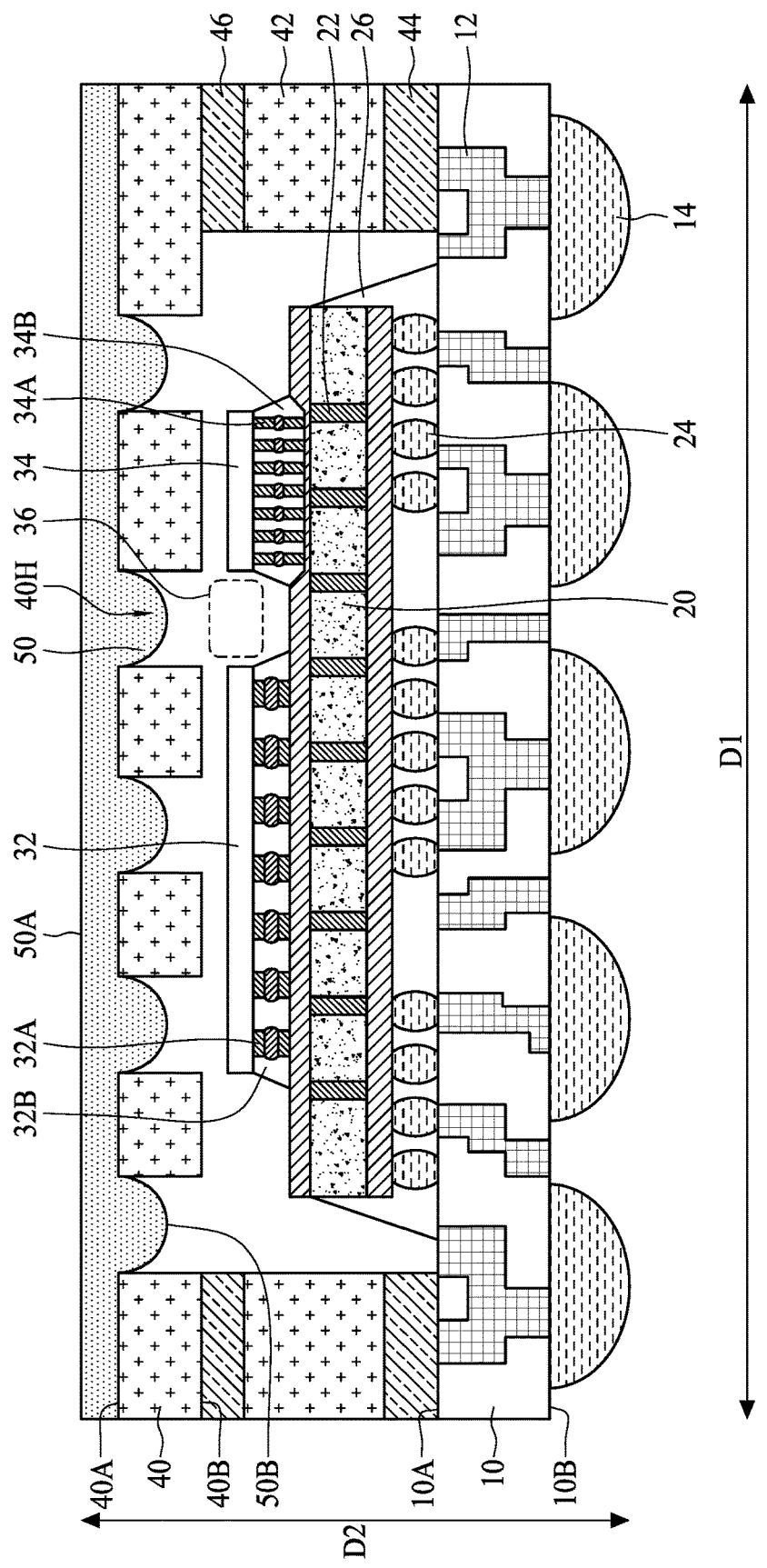
FIG. 12 is a cross-sectional view of a semiconductor device package in accordance with some embodiments of the present disclosure.

FIG. 12 is a cross-sectional view of a semiconductor device package 9 in accordance with some embodiments of the present disclosure. As shown in FIG. 12, in contrast to the semiconductor device package 8 of FIG. 11, the solid state thermal isolation 50 of the semiconductor device package 9 is disposed in the one or more apertures 40H, and further extended to cover at least a portion of the upper surface 40A of the heat dissipation lid 40. In some embodiments, the thermal isolation 50 is partially disposed in the one or more apertures 40H.

Figure 13:
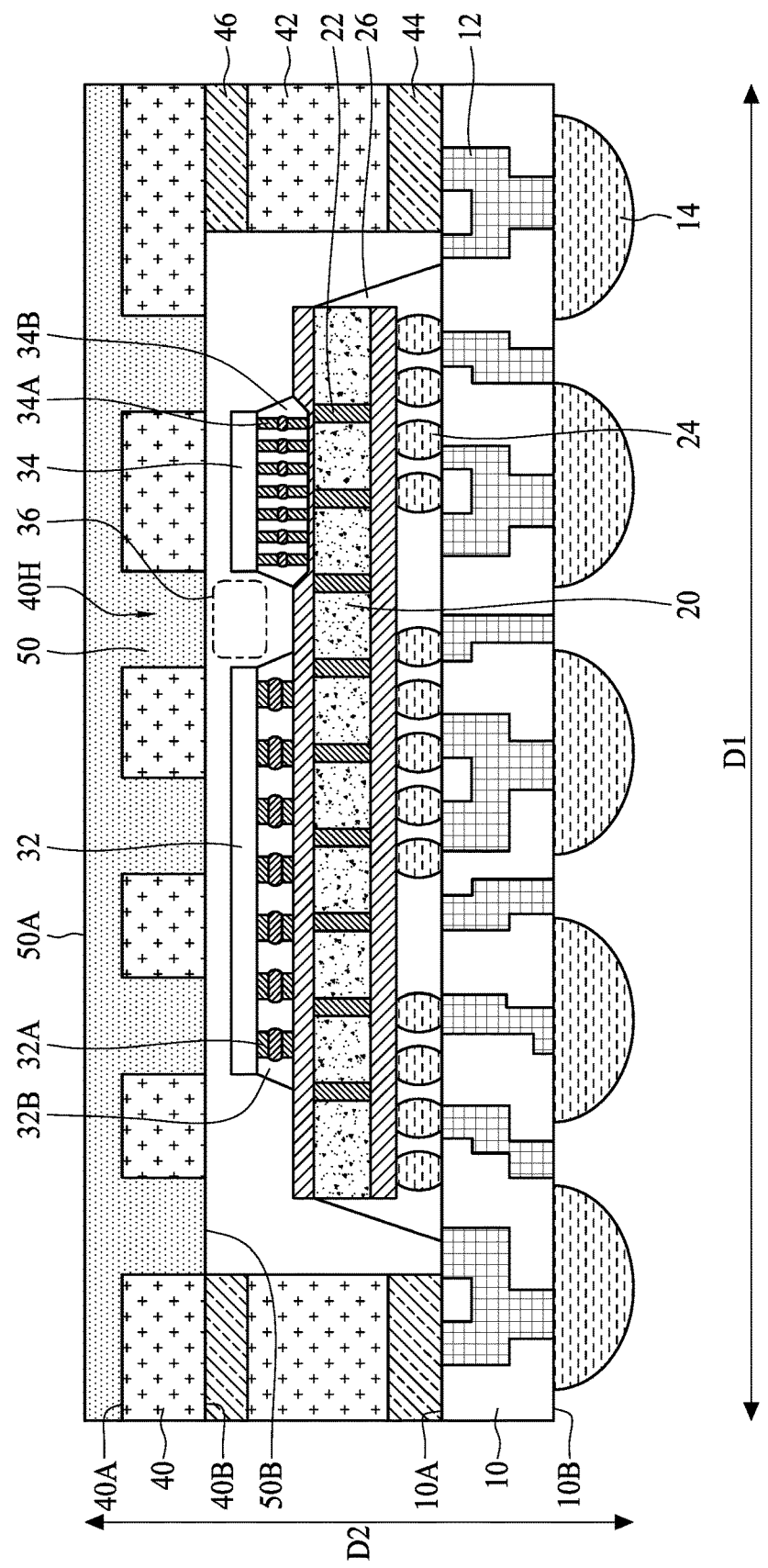
FIG. 13 is a cross-sectional view of a semiconductor device package in accordance with some embodiments of the present disclosure.

FIG. 13 is a cross-sectional view of a semiconductor device package 100 in accordance with some embodiments of the present disclosure. As shown in FIG. 13, in contrast to the semiconductor device package 9 of FIG. 12, the thermal isolation 50 of the semiconductor device package 100 is fully disposed in the one or more apertures 40H.

Figure 14:
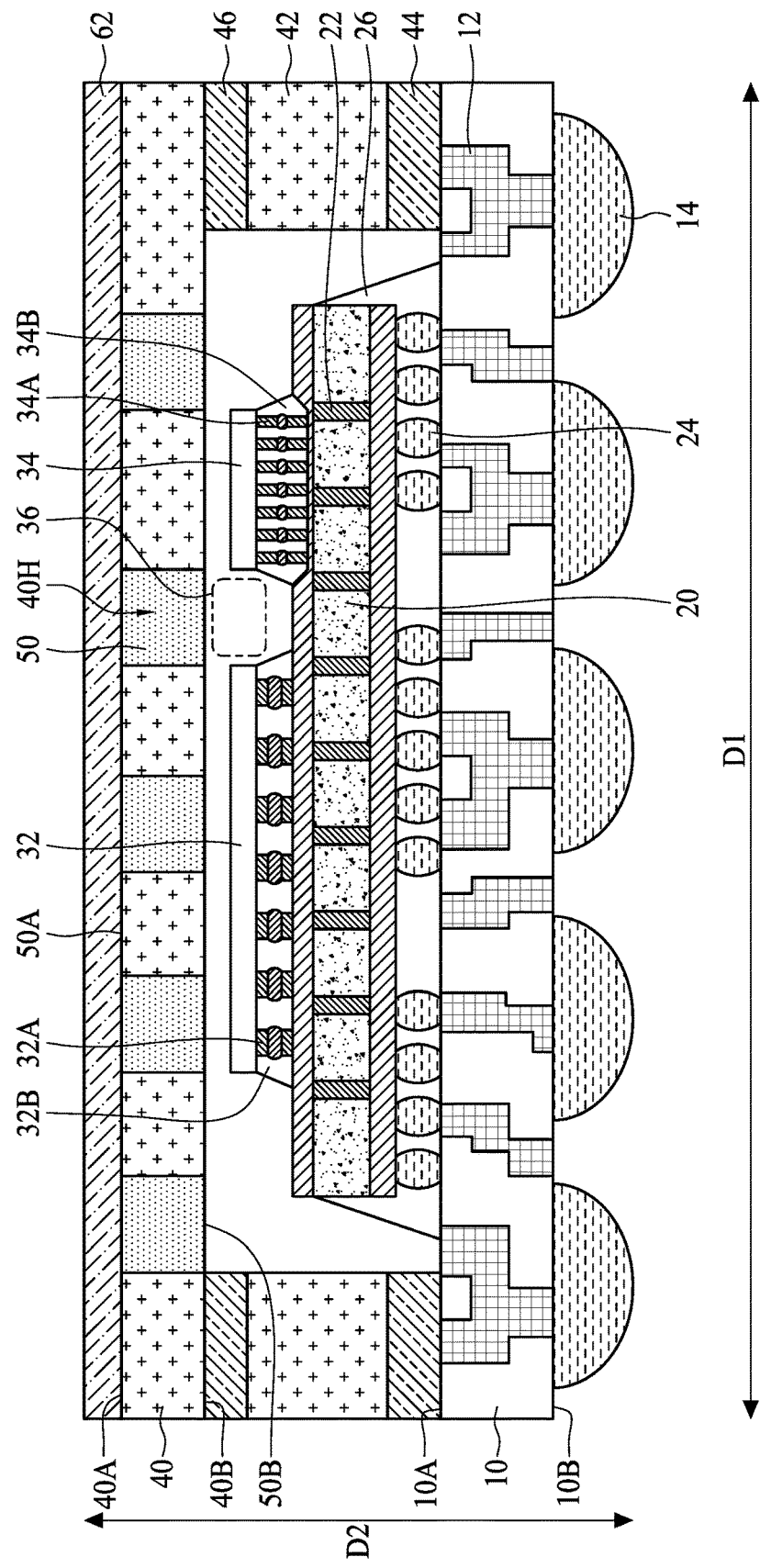
FIG. 14 is a cross-sectional view of a semiconductor device package in accordance with some embodiments of the present disclosure.

FIG. 14 is a cross-sectional view of a semiconductor device package 101 in accordance with some embodiments of the present disclosure. As shown in FIG. 14, in contrast to the semiconductor device package 8 of FIG. 11, the semiconductor device package 101 further includes a thermal interface material 62 over the upper surface 40A of the heat dissipation lid 40 and covering the upper surface 50A of the solid state thermal isolation 50.

Figure 15:
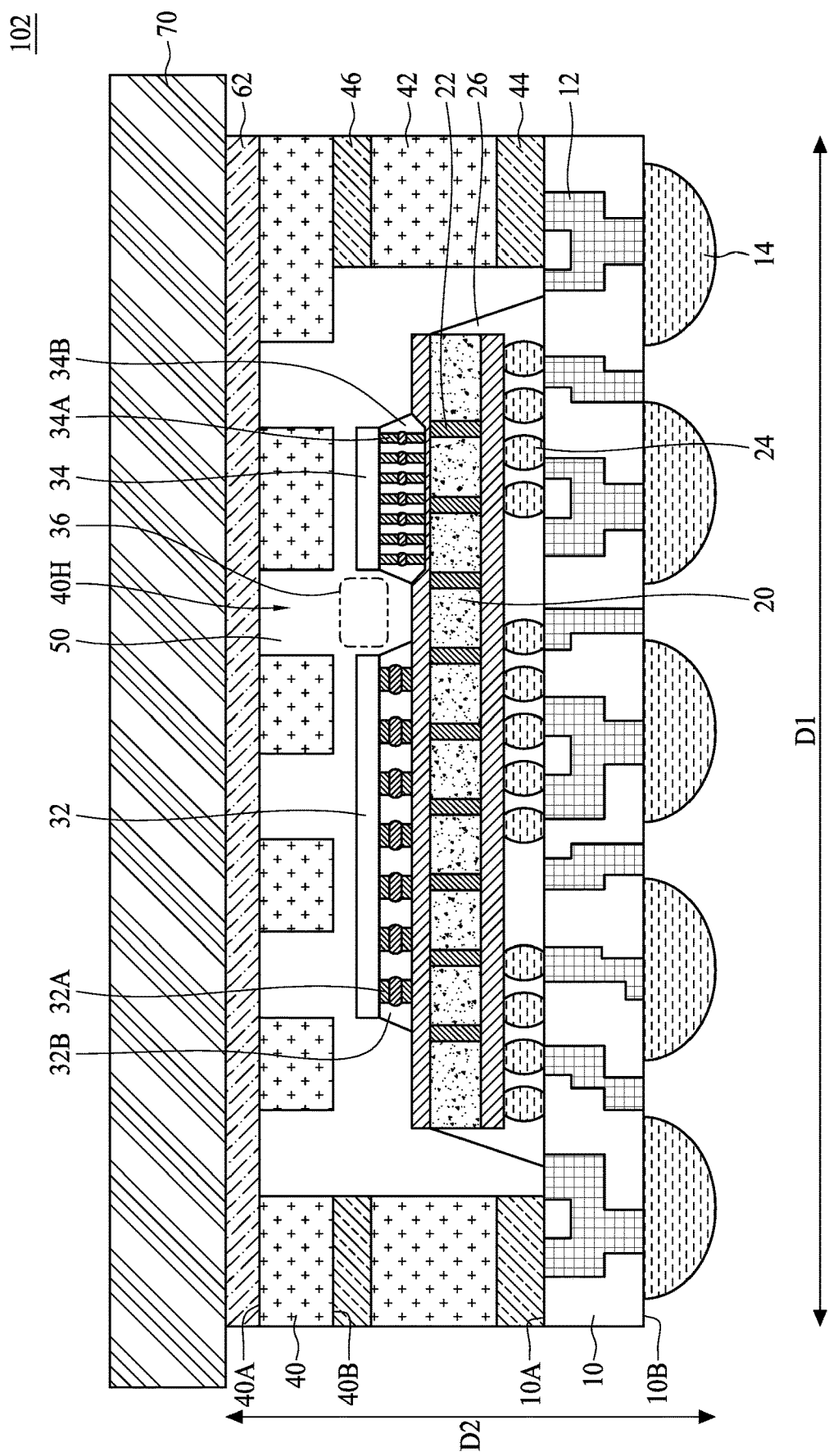
FIG. 15 is a cross-sectional view of a semiconductor device package in accordance with some embodiments of the present disclosure.

FIG. 15 is a cross-sectional view of a semiconductor device package 102 in accordance with some embodiments of the present disclosure. As shown in FIG. 15, in contrast to the semiconductor device package 101 of FIG. 14, the semiconductor device package 102 further includes a heat sink 70 disposed over the thermal interface material 62. The heat sink 70 may be in contact with the thermal interface material 62, or bonded to the thermal interface material 62 with adhesives. In some embodiments, the thermal conductivity of the heat sink 70 is higher than the thermal conductivity of the thermal interface material 62. Examples of the material for the heat sink 70 may include metal, alloy or the like. The thermal isolation 50 of the semiconductor device package 103 is gas state thermal isolation such as air thermal isolation or vacuum thermal isolation. In some embodiments, the gas state thermal isolation may be sealed by the thermal interface material 62 and the heat sink 70.

Figure 16:
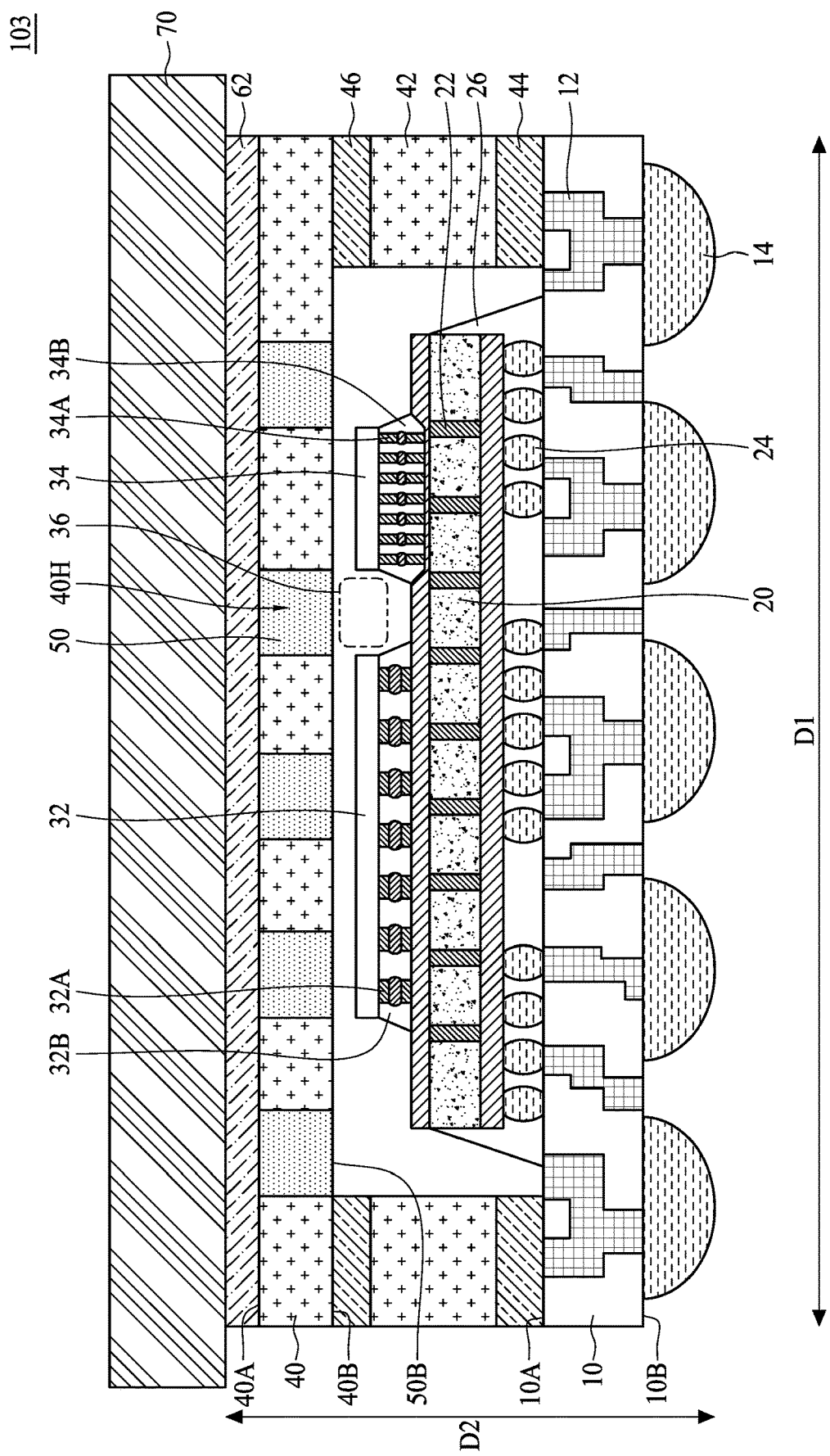
FIG. 16 is a cross-sectional view of a semiconductor device package in accordance with some embodiments of the present disclosure.

FIG. 16 is a cross-sectional view of a semiconductor device package 103 in accordance with some embodiments of the present disclosure. As shown in FIG. 15, in contrast to the semiconductor device package 102 of FIG. 15, the thermal isolation 50 of the semiconductor device package 102 includes solid state thermal isolation.

In the present disclosure, the semiconductor device package includes a combination of the heat dissipation lid 40 having higher thermal conductivity and thermal isolation 50 having lower thermal conductivity. The heat dissipation lid 40 with higher thermal conductivity improves heat dissipation along the vertical direction such that heat generated by the electronic components 32/34 in operation is efficiently dissipated. The thermal isolation 50 with lower thermal conductivity disposed in the one or more apertures 40H inhibits heat transfer in the heat dissipation lid 40 along the lateral direction, thereby reducing interference between the electronic components 32/34. In some embodiments, the temperature difference between the electronic component 32 and the electronic component 34 in operation is used as an indicator to evaluate the heat transfer in the heat dissipation lid along the lateral direction is well inhibited. The thermal resistance θjc can be used as another indicator to evaluate heat dissipation along the vertical direction. The thermal resistance θjc can be expressed by θjc=(Tj−Tc)/P, where θjc is thermal resistance, Tj is a junction temperature of the semiconductor device package, Tc is a surface temperature of the semiconductor device package, and P is a power dissipation of the semiconductor device package.

In different applications, the temperature difference between electronic components of different powers and the thermal resistance θjc may be set to meet different requirements. In some embodiments, the temperature difference between electronic components of different powers is set to be greater than 3° C. or higher, such that interference between the electronic components is avoided. In some embodiments, the thermal resistance θjc is set to be less than 0.041° C./W, 0.04° C./W, or even lower to meet heat dissipation requirements. For 2.5D/3D semiconductor device packages, the temperature difference between electronic components of different powers may be greater than 3° C., such that interference between the electronic components is avoided, and the thermal resistance θjc may be less than 0.041° C./W to meet heat dissipation requirements.

Table 1 lists the result of a simulation of several embodiments of the semiconductor device packages of the present disclosure.

TABLE 1

| | Sample | | | | | | |
|---|---|---|---|---|---|---|---|
| | 1 | 2 | 3 | 4 | 5 | 6 | 7 |
| Number of apertures | 1 | 2 | 3 | 4 | 5 | 6 | 7 |
| Aperture ratio | 8% | 15% | 23% | 31% | 38% | 46% | 53% |
| θjc (° C./W) | 0.037 | 0.035 | 0.041 | 0.040 | 0.034 | 0.034 | 0.053 |
| ΔT (° C.) | 1.6 | 1.7 | 2.2 | 3.2 | 3.3 | 3.4 | 3.5 |

The semiconductor device packages in the simulation of Table 1 have structures similar to that of the semiconductor device package shown in FIG. 16. The thermal isolation 50 is disposed in the aperture(s) 40H and has a thermal conductivity of about 2.89 W/m*K. The thermal conductivity of the thermal interface material 62 between the heat dissipation lid 40/thermal interface material 62 and the heat sink 70 is about 6.8 W/m*K. The thickness of the thermal interface material 62 is about 1 mil. The width of the aperture is about 2 mm. The material of the heat dissipation lid 40 and the heat sink 70 include copper. The number of apertures and the aperture ratios in samples 1-7 differ as listed in Table 1.

As shown in Table 1, the temperature difference ΔT between electronic components of different powers can be modified by altering the number and aperture ratio of the aperture filled with thermal isolation material to meet different requirements. Increasing the number and aperture ratio of the apertures can increase the temperature difference ΔT. The thermal resistance θjc can be modified by altering the number and aperture ratio of the aperture filled with thermal isolation material to meet different requirements. In some embodiments, the aperture ratio is controlled to range from about 8% to about 53%, the temperature difference ΔT can be greater than 1.6° C., and the thermal resistance θjc can be less than 0.053° C./W. In some embodiments, the aperture ratio is controlled to range from about 8% to about 46%, the temperature difference ΔT can be greater than 1.6° C., and the thermal resistance θjc can be less than 0.041° C./W. In some embodiments, the aperture ratio is controlled to range from about 31% to about 53%, the temperature difference ΔT can be greater than 3.2° C., and the thermal resistance θjc can be less than 0.053° C./W. In some embodiments, the aperture ratio is controlled to range from about 31% to about 46%, the temperature difference ΔT can be greater than 3.2° C., and the thermal resistance θjc can be less than 0.040° C./W.

In some embodiments of the present disclosure, the semiconductor device package includes a combination of a heat dissipation lid having higher thermal conductivity and thermal isolation having lower thermal conductivity. The heat dissipation lid with higher thermal conductivity improves heat dissipation along the vertical direction such that heat generated by the electronic components in operation is efficiently dissipated. The thermal isolation with lower thermal conductivity disposed in the one or more apertures inhibits heat transfer in the heat dissipation lid along the lateral direction, thereby preventing damage to the lower-power electronic component.

As used herein, the singular terms "a," "an," and "the" may include a plurality of referents unless the context clearly dictates otherwise.

As used herein, the terms "conductive," "electrically conductive," and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material has a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. A semiconductor device package, comprising:
   a substrate having a surface;
   a first electronic component and a second electronic component disposed over the surface of the substrate and arranged along a direction substantially parallel to the surface, wherein the first electronic component and the second electronic component are separated by a space therebetween;
   a heat dissipation lid disposed over the first electronic component and the second electronic component, wherein the heat dissipation lid defines one or more apertures at least over the space between the first electronic component and the second electronic component; and a thermal isolation disposed in the one or more apertures of the heat dissipation lid, wherein the one or more apertures includes a first aperture over the space between the first electronic component and the second electronic component, and one or more second apertures over at least one of the first electronic component or the second electronic component, and the first aperture is distinct from the one or more second apertures, wherein the first aperture partially overlaps an edge of the first electronic component and an edge of the second electronic component.

2. The semiconductor device package of claim 1, wherein a thermal conductivity of the heat dissipation lid is higher than a thermal conductivity of the thermal isolation.

3. The semiconductor device package of claim 2, wherein a ratio of the thermal conductivity of the heat dissipation lid to the thermal conductivity of the thermal isolation is higher than 30.

4. The semiconductor device package of claim 1, wherein an aperture ratio of an area of the one or more apertures to an area of the heat dissipation lid substantially ranges from about 8% to about 53%.

5. The semiconductor device package of claim 4, wherein the aperture ratio of the area of the one or more apertures to the area of the heat dissipation lid substantially ranges from about 8% to about 46%.

6. The semiconductor device package of claim 4, wherein the aperture ratio of the area of the one or more apertures to the area of the heat dissipation lid substantially ranges from about 31% to about 53%.

7. The semiconductor device package of claim 4, wherein the aperture ratio of the area of the one or more apertures to the area of the heat dissipation lid substantially ranges from about 31% to about 46%.

8. The semiconductor device package of claim 1, wherein the heat dissipation lid is in contact with the first electronic component and the second electronic component.

9. The semiconductor device package of claim 1, wherein the heat dissipation lid is separated from the first electronic component and the second electronic component.

10. The semiconductor device package of claim 9, wherein a gap between the heat dissipation lid and the first electronic component/the second electronic component and measured in a second direction perpendicular to the surface of the substrate ranges from about 1 micrometer to about 200 micrometers.

11. The semiconductor device package of claim 1, wherein the thermal isolation comprises a gas state thermal isolation, a solid state thermal isolation, a vacuum thermal isolation, or a combination thereof.

12. The semiconductor device package of claim 1, wherein the heat dissipation lid includes a bottom surface facing the first electronic component and the second electronic component, and an upper surface opposite to the bottom surface, and the thermal isolation further covers at least a portion of the upper surface of the heat dissipation lid.

13. The semiconductor device package of claim 1, further comprising a first thermal interface material between the heat dissipation lid and the first electronic component, and between the heat dissipation lid and the second electronic component.

14. The semiconductor device package of claim 1, further comprising a second thermal interface material over the heat dissipation lid and the thermal isolation.

15. The semiconductor device package of claim 14, further comprising a heat sink over the second thermal interface material.

16. A semiconductor device package, comprising:
a substrate having a surface;
a plurality of electronic components disposed over the surface of the substrate, wherein at least two adjacent electronic components are separated by a space;
a heat dissipation lid disposed over the electronic components, wherein the heat dissipation lid defines one or more apertures, wherein the one or more apertures includes a first aperture over the space, and one or more second apertures over at least one of the electronic components, and the first aperture is physically distinct from the one or more second apertures; and
a thermal isolation disposed in the one or more apertures of the heat dissipation lid, wherein a ratio of a thermal conductivity of the heat dissipation lid to a thermal conductivity of the thermal isolation is higher than 30.

* * * * *